United States Patent
Royster, Jr. et al.

(10) Patent No.: US 8,324,800 B2
(45) Date of Patent: Dec. 4, 2012

(54) PHOSPHORESCENT OLED DEVICE WITH MIXED HOSTS

(75) Inventors: Tommie L. Royster, Jr., Rochester, NY (US); Marina E. Kondakova, Kendall, NY (US)

(73) Assignee: Global OLED Technology LLC, Wilmington, DE (US)

( * ) Notice: Subject to any disclaimer, the term of this patent is extended or adjusted under 35 U.S.C. 154(b) by 967 days.

(21) Appl. No.: 12/137,878

(22) Filed: Jun. 12, 2008

(65) Prior Publication Data

US 2009/0309487 A1 Dec. 17, 2009

(51) Int. Cl.
*H01J 1/62* (2006.01)
*C09K 11/06* (2006.01)

(52) U.S. Cl. ... 313/504; 428/690; 428/917; 252/301.16; 252/301.35

(58) Field of Classification Search .......... None
See application file for complete search history.

(56) References Cited

U.S. PATENT DOCUMENTS

| | | | |
|---|---|---|---|
| 3,172,862 A | 3/1965 | Gurnee et al. | 252/301.16 |
| 3,173,050 A | 3/1965 | Gurnee | 313/504 |
| 3,180,730 A | 4/1965 | Klupfel et al. | |
| 3,567,450 A | 3/1971 | Brantly et al. | |
| 3,658,520 A | 4/1972 | Brantly et al. | |
| 3,710,167 A | 1/1973 | Dresner et al. | 313/504 |
| 4,356,429 A | 10/1982 | Tang | 428/136 |
| 4,720,432 A | 1/1988 | Vanslyke et al. | |
| 4,769,292 A | 9/1988 | Tang et al. | 8/690 |
| 4,885,211 A | 12/1989 | Tang et al. | |
| 4,885,221 A | 12/1989 | Tsuneeda et al. | |
| 5,059,861 A | 10/1991 | Littman et al. | |
| 5,059,862 A | 10/1991 | Vanslyke et al. | |
| 5,061,569 A | 10/1991 | Vanslyke et al. | |
| 5,247,190 A | 9/1993 | Friend et al. | |
| 5,276,380 A | 1/1994 | Tang | |
| 5,283,182 A | 2/1994 | Powell et al. | |
| 5,294,870 A | 3/1994 | Tang et al. | |
| 5,405,709 A | 4/1995 | Littman et al. | |
| 5,503,910 A | 4/1996 | Matsuura et al. | |
| 5,552,678 A | 9/1996 | Tang et al. | |
| 5,608,287 A | 3/1997 | Hung et al. | |
| 5,645,948 A | 7/1997 | Shi et al. | |
| 5,677,572 A | 10/1997 | Hung et al. | |
| 5,683,823 A | 11/1997 | Shi et al. | |

(Continued)

FOREIGN PATENT DOCUMENTS

EP 0 732 868 9/1996

(Continued)

OTHER PUBLICATIONS

Adachi et al., "Efficient electrophosphorescence using a doped ambipolar conductive molecular organic thin film", Organic Electronics 2, pp. 37-43, 2001.

(Continued)

*Primary Examiner* — Camie Thompson
(74) *Attorney, Agent, or Firm* — McKenna Long & Aldridge LLP

(57) ABSTRACT

An OLED device comprises a cathode, an anode, and has therebetween a light-emitting layer containing a phosphorescent emitter that emits yellow, orange or red light; a tertiary arylamine compound as a first host material, and a gallium complex with only nitrogen bidentate ligands as a second host material. Desirably, the phosphorescent emitter is an iridium complex.

16 Claims, 1 Drawing Sheet

U.S. PATENT DOCUMENTS

| | | | |
|---|---|---|---|
| 5,688,551 A | 11/1997 | Littman et al. | |
| 5,703,436 A | 12/1997 | Forrest et al. | |
| 5,714,838 A | 2/1998 | Haight et al. | |
| 5,739,545 A | 4/1998 | Guha et al. | |
| 5,766,779 A | 6/1998 | Shi et al. | |
| 5,776,622 A | 7/1998 | Hung et al. | |
| 5,776,623 A | 7/1998 | Hung et al. | |
| 5,837,391 A | 11/1998 | Utsugi | |
| 5,851,709 A | 12/1998 | Grande et al. | |
| 5,969,474 A | 10/1999 | Arai | |
| 5,981,306 A | 11/1999 | Burrows et al. | |
| 6,001,284 A | 12/1999 | Enokida et al. | |
| 6,013,384 A | 1/2000 | Kido et al. | |
| 6,066,357 A | 5/2000 | Tang et al. | |
| 6,097,147 A | 8/2000 | Baldo et al. | |
| 6,127,004 A | 10/2000 | Hatwar et al. | |
| 6,137,223 A | 10/2000 | Hung et al. | |
| 6,140,763 A | 10/2000 | Hung et al. | |
| 6,172,459 B1 | 1/2001 | Hung et al. | |
| 6,208,075 B1 | 3/2001 | Hung et al. | |
| 6,208,077 B1 | 3/2001 | Hung | |
| 6,226,890 B1 | 5/2001 | Boroson et al. | |
| 6,237,529 B1 | 5/2001 | Spahn et al. | |
| 6,278,236 B1 | 8/2001 | Madathil et al. | |
| 6,284,393 B1 | 9/2001 | Hosokawa et al. | |
| 6,337,492 B1 | 1/2002 | Jones et al. | |
| 6,413,656 B1 | 7/2002 | Thompson et al. | |
| 6,420,057 B1 | 7/2002 | Ueda et al. | 428/690 |
| 6,451,415 B1 | 9/2002 | Forrest et al. | |
| 6,451,455 B1 | 9/2002 | Thompson et al. | |
| 6,458,475 B1 | 10/2002 | Adachi et al. | |
| 6,515,298 B2 | 2/2003 | Forrest et al. | |
| 6,573,651 B2 | 6/2003 | Adachi et al. | |
| 6,627,333 B2 | 9/2003 | Hatwar | |
| 7,045,952 B2 | 5/2006 | Lu | |
| 7,128,982 B2 | 10/2006 | Oshiyama et al. | |
| 7,132,174 B2 | 11/2006 | Wang et al. | |
| 7,569,288 B2 * | 8/2009 | Royster et al. | 428/690 |
| 7,709,105 B2 * | 5/2010 | Kondakov et al. | 428/690 |
| 2002/0015859 A1 | 2/2002 | Watanabe et al. | |
| 2002/0025419 A1 | 2/2002 | Lee et al. | |
| 2002/0100906 A1 | 8/2002 | Takiguchi et al. | |
| 2002/0117662 A1 | 8/2002 | Nii | |
| 2002/0121638 A1 | 9/2002 | Grushin et al. | |
| 2002/0186214 A1 | 12/2002 | Siwinski | |
| 2002/0197511 A1 | 12/2002 | D Andrade et al. | |
| 2003/0017361 A1 | 1/2003 | Thompson et al. | |
| 2003/0040627 A1 | 2/2003 | Fujii | |
| 2003/0054198 A1 | 3/2003 | Tsuboyama et al. | |
| 2003/0059646 A1 | 3/2003 | Kamatani et al. | |
| 2003/0059647 A1 | 3/2003 | Thompson et al. | 8/690 |
| 2003/0068526 A1 | 4/2003 | Kamatani et al. | |
| 2003/0068528 A1 | 4/2003 | Thompson et al. | 8/690 |
| 2003/0068535 A1 | 4/2003 | Takiguchi et al. | |
| 2003/0072964 A1 | 4/2003 | Kwong et al. | |
| 2003/0104243 A1 | 6/2003 | Aziz et al. | 8/690 |
| 2003/0124381 A1 | 7/2003 | Thompson et al. | |
| 2003/0141809 A1 | 7/2003 | Furugori et al. | |
| 2003/0175553 A1 | 9/2003 | Thompson et al. | |
| 2004/0009367 A1 | 1/2004 | Hatwar | |
| 2004/0209115 A1 | 10/2004 | Thompson et al. | |
| 2004/0209116 A1 | 10/2004 | Ren et al. | |
| 2006/0063027 A1 | 3/2006 | Vestweber et al. | 428/690 |
| 2006/0246315 A1 | 11/2006 | Begley et al. | |
| 2007/0003786 A1 | 1/2007 | Royster, Jr. | 84/423 R |
| 2007/0017342 A1 | 1/2007 | Nishida | 428/690 |
| 2007/0134514 A1 | 6/2007 | Kondakov et al. | 428/690 |
| 2007/0166566 A1 * | 7/2007 | Royster et al. | 428/690 |
| 2007/0207345 A1 | 9/2007 | Royster et al. | 428/690 |
| 2008/0020234 A1 | 1/2008 | Ren et al. | |

FOREIGN PATENT DOCUMENTS

| | | |
|---|---|---|
| EP | 0 891 121 | 1/1999 |
| EP | 1 009 041 | 6/2000 |
| EP | 1 029 909 | 8/2000 |
| EP | 1 076 368 | 2/2001 |
| EP | 1 182 244 | 2/2002 |
| EP | 1 187 235 | 3/2002 |
| EP | 1 311 141 | 8/2002 |
| EP | 1 238 981 | 9/2002 |
| EP | 1 239 526 | 9/2002 |
| EP | 1 244 155 | 9/2002 |
| JP | 1997-003447 | 1/1997 |
| JP | 2001-081453 | 3/2001 |
| JP | 2002-110357 | 4/2002 |
| JP | 2003-059667 | 2/2003 |
| JP | 2003-073387 | 3/2003 |
| JP | 2003-073388 | 3/2003 |
| JP | 2003-073665 | 3/2003 |
| WO | WO 00/57676 | 9/2000 |
| WO | WO 00/70655 | 11/2000 |
| WO | WO 01/39234 | 5/2001 |
| WO | WO 01/41512 | 6/2001 |
| WO | WO 01/93642 | 12/2001 |
| WO | WO 02/15645 | 2/2002 |
| WO | WO 02/071813 | 9/2002 |
| WO | WO 02/074015 | 9/2002 |

OTHER PUBLICATIONS

Kido et al., "Bright red light-emitting organic electroluminescent devices having a europium complex as an emitter", Appl. Phys. Lett., 65 (17), pp. 2124-2126, 1994.

Adachi et al., "Endothermic energy transfer: A mechanism for generating very efficient high-energy phosphorescent emission in organic materials", Appl. Phys. Lett. vol. 79, No. 13, pp. 2082-2084, 2001.

Adachi et al., "High-efficiency red electrophosphorescence devices", App. Phys. Lett., vol. 78, No. 11, pp. 1622-1624, 2001.

Double Injection Electroluminescence in Anthracene by J. Dresner, RCA Laboratories, Princton, NJ, pp. 322-334, Jun. 1969.

Electroluminescense of doped organic thin films, C.W. Tang, S.A. VanSlyke and C.H. Chen, J. Appl. Phys. 65(9), May 1, 1989, pp. 3610-3616.

* cited by examiner

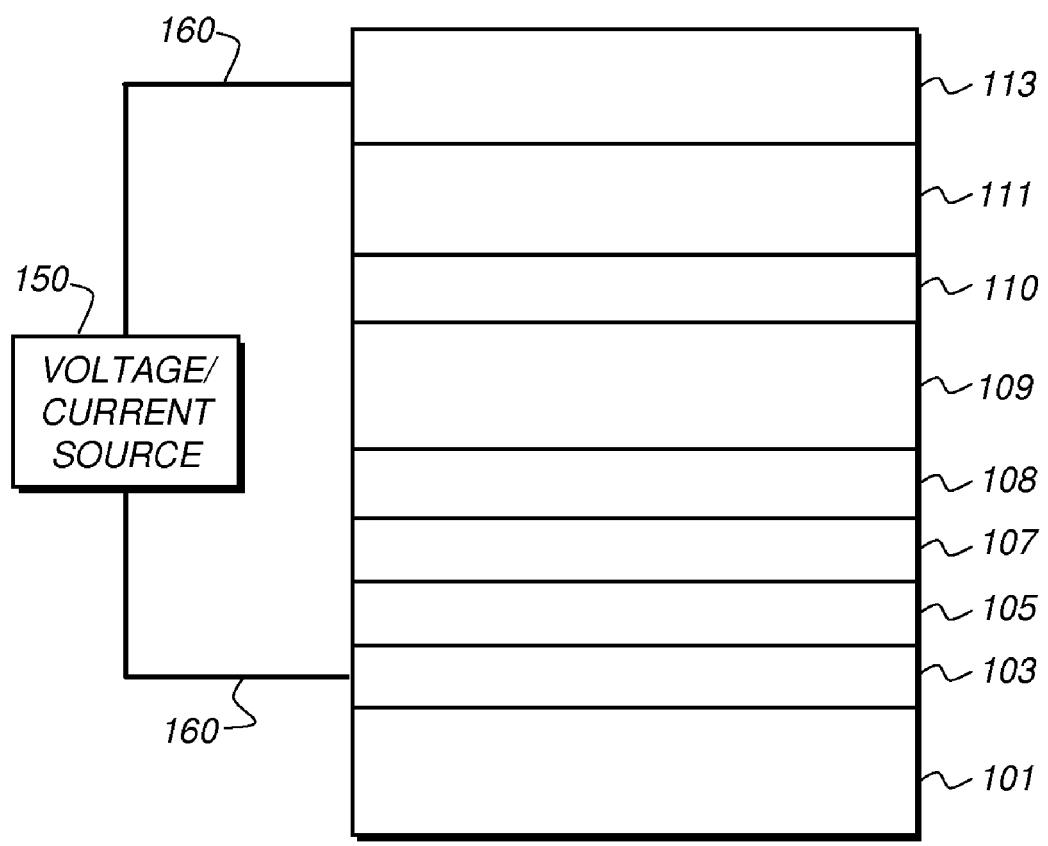

PHOSPHORESCENT OLED DEVICE WITH MIXED HOSTS

FIELD OF INVENTION

This invention relates to organic electroluminescent (OLED) devices containing a yellow, orange or red light-emitting layer including a phosphorescent emitter and a mixture of particular gallium complexes and hole-transporting materials as hosts. More specifically, this invention relates to efficient and low voltage phosphorescent EL devices with improved operational stability.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322-334, 1969; and Dresner U.S. Pat. No.3,710,167, issued Jan. 9, 1973. The organic layers in these devices, usually composed of a polycyclic aromatic hydrocarbon, were very thick (much greater than 1 µm). Consequently, operating voltages were very high, often >100V.

More recent organic EL devices include an organic EL element consisting of extremely thin layers (e.g. <1.0 µm) between the anode and the cathode. Herein, the term "organic EL element" encompasses the layers between the anode and cathode electrodes. Reducing the thickness lowered the resistance of the organic layer and has enabled devices that operate at a much lower voltage. In a basic two-layer EL device structure, described first in U.S. Pat. No. 4,356,429, one organic layer of the EL element adjacent to the anode is specifically chosen to transport holes, therefore, it is referred to as the hole-transporting layer, and the other organic layer is specifically chosen to transport electrons, referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by Tang et al [*J. Applied Physics*, Vol. 65, Pages 3610-3616, 1989]. The light-emitting layer commonly consists of a host material doped with a guest material. Still further, there has been proposed in U.S. Pat. No. 4,769,292 a four-layer EL element comprising a hole-injecting layer (HIL), a hole-transporting layer (HTL), a light-emitting layer (LEL) and an electron transport/injection layer (ETL). These structures have resulted in improved device efficiency. The light-emitting layer is typically composed of at least one host material which does not significantly contribute to light emission and an emissive material (typically referred to as a dopant) which emits the desired color of light. It is also well known to use mixtures of compounds as co-hosts in LELs to control the characteristics and performance of the LEL.

Many emitting materials that have been described as useful in an OLED device emit light from their excited singlet state by fluorescence. The excited singlet state is created when excitons formed in an OLED device transfer their energy to the excited state of the dopant. However, it is generally believed that only 25% of the excitons created in an EL device are singlet excitons. The remaining excitons are triplet, which cannot transfer their energy to the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases singlet excitons can also transfer their energy to lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission.

EP 1311141A1 discloses red light-emitting OLEDs with a mixture of a tertiary aromatic amine and a metal oxinoid compound as co-hosts with a red light emitting phosphorescent dopant. The metal oxinoid compound may be a gallium oxinoid. A related application, US 2003/0104243A1, discloses the same combination of co-hosts with a green fluorescent dopant.

US 2006/0063027A1 discloses OLED devices with a light-emitting layer containing a mixture of a hole-conducting material, including tertiary aromatic amines, and a metal oxinoid compound, including a gallium oxinoid, as co-hosts with a light-emitting dopant, including a phosphorescent dopant.

Commonly assigned US 2007/0134514A1 discloses OLED devices with a light-emitting layer containing a mixture of a tertiary aromatic amine and gallium complexes with 2-(2-hydroxyphenyl)pyridine ligands as co-hosts with a phosphorescent dopant.

Commonly assigned US 2007/0207345A1, US 2007/017342A1, US 20070166566A1 and US 2007/0003786A1 all disclose the use of gallium complexes with nitrogen bidentate ligands in layers other than light-emitting layers. Other references that disclose the use of metal, including gallium, complexes with bidentate nitrogen ligands include U.S. Pat. No. 6,420,057, JP2001081453, JP09003447 and JP2002110357.

Notwithstanding these developments, there remains a need for materials that will function as a host for a phosphorescent emitter in electroluminescent devices having improved luminous efficiency, low drive voltage and, most importantly, long operational lifetime.

SUMMARY OF THE INVENTION

The invention provides an OLED device comprising a cathode, an anode, and having therebetween a light-emitting layer containing:
(i) a phosphorescent emitter that emits yellow, orange or red light;
(ii) a tertiary arylamine compound as a first host material, and
(iii) a gallium complex with only nitrogen bidentate ligands as a second host material The improvements found in devices of the invention include improved luminance, efficiency, drive voltage and operational stability.

BRIEF DESCRIPTION OF THE DRAWINGS

The FIGURE shows a schematic cross-sectional view of one embodiment of the OLED device of the present invention. It will be understood that the figure is not to scale since the individual layers are too thin and the thickness differences of various layers are too great to permit depiction to scale.

DETAILED DESCRIPTION OF THE INVENTION

An OLED device of the invention is a multilayer electroluminescent device comprising a cathode, an anode, light-emitting layer(s) (LEL), electron-transporting layer(s) (ETL) and electron-injecting layer(s) (EIL) and optionally, additional layers such as hole-injecting layer(s), hole-transporting layer(s), exciton-blocking layer(s), blocking layers, spacer layer(s), connecting layer(s) and hole-blocking layer(s).

The LEL of an OLED of the invention contains a phosphorescent light-emitting compound that emits yellow, orange or red light. It does not emit significant amounts of blue or green light. By not significant, it is meant that less than 10% of the total amount of light that is emitted in these spectral regions. A yellow light emitter will have its primary emission in the range of 560 to 590 nm. An orange light emitter will have its primary emission in the range of 590 to 630 nm. A red light emitter will have its primary emission greater than 630 nm but less than 780 nm. Suitable phosphorescent emitters are metal complexes; preferred emitters are iridium complexes. The optimum concentration of the phosphorescent emitter is about 1 to 20 vol. % and preferably 4 to 16 vol. % relative to the total amount of host material The LEL of an OLED of the invention contains a first host which is a tertiary arylamine which transports holes and serves as a hole-transporting co-host. Aromatic tertiary arylamines are compounds containing at least one trivalent nitrogen atom that is bonded only to carbon atoms, at least one of which is a member of an aromatic ring. The aromatic tertiary arylamine can be a monoarylamine, diarylamine, triarylamine, or a polymeric arylamine Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et at. in U.S. Pat. Nos. 3,567,450 and 3,658,520.

One preferred class of aromatic tertiary amines for a hole-transporting first host are those which include at least two aromatic tertiary amine moieties, such as tetraaryldiamines, as described in U.S. Pat. Nos. 4,720,432 and 5,061,569. Desirable tetraaryldiamines include two diarylamino groups, such as indicated by formula (PH1-1):

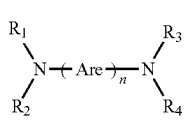

(PH1-1)

wherein each Are is an independently selected arylene group, such as a phenylene or anthracene moiety, n is selected from 1 to 4, and $R_1$—$R_4$ are independently selected aryl groups.

In a typical embodiment, at least one of $R_1$—$R_4$ is a polycyclic fused ring structure, e.g., a naphthalene.

Representative examples of the useful compounds as the first host include the following:

4,4'-Bis[N-(1-naphthyl)-N-phenylamino]biphenyl (NPB);

4,4'-Bis[N-(1-naphthyl)-N-(2-naphthyl)amino]biphenyl (TNB);

4,4'-Bis[N-(3-methylphenyl)-N-phenylamino]biphenyl (TPD);

4,4'-Bis-diphenylamino-terphenyl; and 2,6,2',6'-tetramethyl-N,N,N',N'-tetraphenyl-benzidine.

Another preferred class of aromatic tertiary amines for a hole-transporting first host are those of formula (PH1-2):

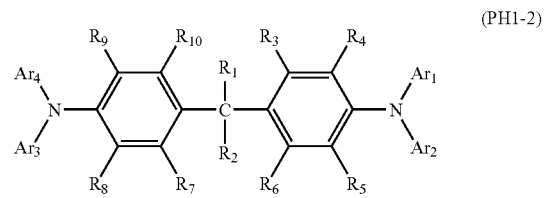

(PH1-2)

In formula (PH1-2), $R_1$ and $R_2$ represent substituents, provided that $R_1$ and $R_2$ can join to form a ring. For example, $R_1$ and $R_2$ can be methyl groups or join to form a cyclohexyl ring;

$Ar_1$-$Ar_4$ represent independently selected aromatic groups, for example phenyl groups or tolyl groups;

$R_3$-$R_{10}$ independently represent hydrogen, alkyl, substituted alkyl, aryl, substituted aryl group.

Examples of suitable materials include, but are not limited to:

1,1-Bis(4-(N,N-di-p-tolylamino)phenyl)cyclohexane (TAPC);

1,1-Bis(4-(N,N-di-p-tolylamino)phenyl)cyclopentane;

4,4'-(9H-fluoren-9-ylidene)bis[N,N-bis(4-methylphenyl)-benzenamine;

1,1-Bis(4-(N,N-di-p-tolylamino)phenyl)-4-phenylcyclohexane;

1,1-Bis(4-(N,N-di-p-tolylamino)phenyl)-4-methylcyclohexane;

1,1-Bis(4-(N,N-di-p-tolylamino)phenyl)-3-phenylpropane;

Bis[4-(N,N-diethylamino)-2-methylphenyl](4-methylpenyl)methane;

Bis[4-(N,N-diethylamino)-2-methylphenyl](4-methylphenyl)ethane;

4-(4-Diethylaminophenyl)triphenylmethane; and 4,4'-Bis(4-diethylaminophenyl)diphenylmethane.

Another preferred class of aromatic tertiary amines for a hole-transporting first host is those of formula represented by formula (PH1-3):

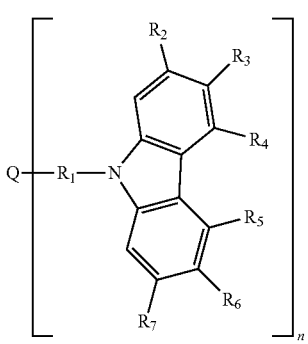

(PH1-3)

In formula (PH1-3), Q independently represents nitrogen, carbon, silicon, a substituted silicon group, an aryl group, or substituted aryl group, preferably a phenyl group;

$R_1$ is preferably an aryl or substituted aryl group, and more preferably a phenyl group, substituted phenyl, biphenyl, substituted biphenyl group;

$R_2$ through $R_7$ are independently hydrogen, alkyl, phenyl or substituted phenyl group, aryl amine, carbazole, or substituted carbazole;

and n is selected from 1 to 4.

Illustrative useful substituted carbazoles are the following:

4-(9H-carbazol-9-yl)-N,N-bis[4-(9H-carbazol-9-yl)phenyl]-benzenamine (TCTA). This material is also named 4,4',4"-tris(carbazolyl)-triphenylamine;

4-(3-phenyl-9H-carbazol-9-yl)-N,N-bis[4(3-phenyl-9H-carbazol-9-yl)phenyl]-benzenamine;

9,9'-[5'-[4-(9H-carbazol-9-yl)phenyl][1,1':3',1"-terphenyl]-4,4"-diyl]bis-9H-carbazole; and 3,5-bis(9-carbazolyl)tetraphenylsilane (SimCP).

Another preferred class of aromatic tertiary amines for a hole-transporting first host is those of formula (PH1-4):

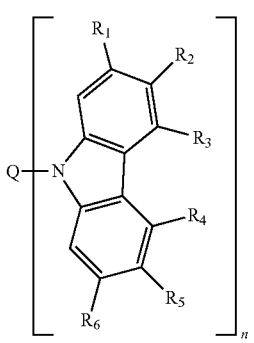

(PH1-4)

In formula (PH 1-4), n is selected from 1 to 4;

Q independently represents phenyl group, substituted phenyl group, biphenyl, substituted biphenyl group, aryl, or substituted aryl group;

$R_1$ through $R_6$ are independently hydrogen, alkyl, phenyl or substituted phenyl, aryl amine, carbazole, or substituted carbazole.

Examples of suitable materials are the following:

9,9'-(2,2'-dimethyl[1,1'-biphenyl]-4,4'-diyl)bis-9H-carbazole (CDBP);

9,9'-[1,1'-biphenyl]-4,4'-diyl)bis-9H-carbazole (CBP);

9,9'-(1,3-phenylene)bis-9H-carbazole (mCP);

9,9'-(1,4-phenylene)bis-9H-carbazole;

9,9',9"-(1,3,5-benzenetriyl)tris-9H-carbazole;

9,9'-(1,4-phenylene)bis[N,N,N',N'-tetraphenyl-9H-carbazole-3,6-diamine;

9-[4-(9H-carbazol-9-yl)phenyl]-N,N-diphenyl-9H-carbazol-3-amine;

9,9'-(1,4-phenylene)bis[N,N-diphenyl-9H-carbazol-3-amine; and

9-[4-(9H-carbazol-9-yl)phenyl]-N,N,N',N'-tetraphenyl-9H-carbazole-3,6-diaamine.

Another preferred class of aromatic tertiary amines are triphenylamine substituted with additional tertiary arylamino groups such as those indicated by formula (PH1-5):

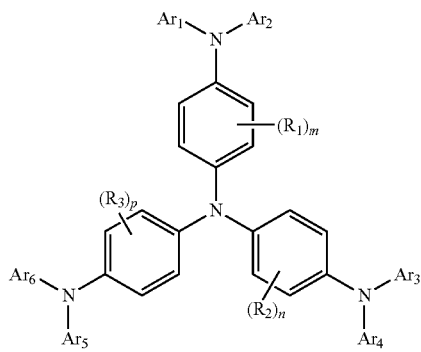

(PH1-5)

In formula (PH1-5), $Ar_1$-$Ar_6$ independently represent aromatic groups, for example, phenyl groups or tolyl groups;

$R_1$-$R_3$ independently represent hydrogen or independently selected substituent, for example an alkyl group containing from 1 to 4 carbon atoms, an aryl group, a substituted aryl group; and m, n and p are each individually 0-4.

Examples of the suitable materials include, but are not limited to:

4,4',4"-tris[(3-methylphenyl)phenylamino]triphenylamine (MTDATA);

4,4',4"-(N,N-diphenyl-amino) triphenylamine (TDATA);

N,N-bis[2,5-dimethyl-4-[(3-methylphenyl)phenylamino]phenyl]-2,5-dimethyl-N'-(3-methylphenyl)-N'-phenyl-1,4-benzenediamine.

Depending on the phosphorescent emitter, it is desirable for the tertiary arylamine first host to be present at 60 vol % or less of all the host materials present in the LEL. For yellow light emitters, preferred ranges for the first host are between 60 and 30%. For orange and red light emitters, preferred ranges are between 40 and 5%.

The LEL of an OLED of the invention contains a second host which is an organic gallium complex according to Formula (PH2-1):

GaL$_3$  Formula (PH2-1)

where the gallium is in a +3 valence state and L represent a mono anionic ligand such that the complex has an overall neutral charge. The L groups can be the same or different but at least one must be organic. All three ligands are bidentate and contain at least one nitrogen that can form a dative or coordinative bond to the gallium.

The most preferred organic gallium complexes are according to Formula (PH2-2):

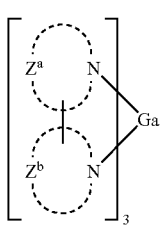

(PH2-2)

In Formula (PH2-2), the ligands in the metal complex can each be the same or different from one another. In one embodiment, the ligands are the same.

Each $Z^a$ and $Z^b$ is independently selected and represents the atoms necessary to complete an unsaturated heterocyclic ring. For example, $Z^a$ and $Z^b$ can represent the atoms necessary to complete an unsaturated five- or six-membered heterocyclic ring. In one embodiment, the ring is an aromatic ring. Examples of suitable aromatic rings are a pyridine ring group and an imidazole ring group.

$Z^a$ and $Z^b$ are directly bonded to one another. In addition to being directly bonded, $Z^a$ and $Z^b$ can be further linked together to form a fused ring system. However, in one embodiment, $Z^a$ and $Z^b$ are not firer linked together.

Illustrative examples of $Z^a$ and $Z^b$ are shown below.

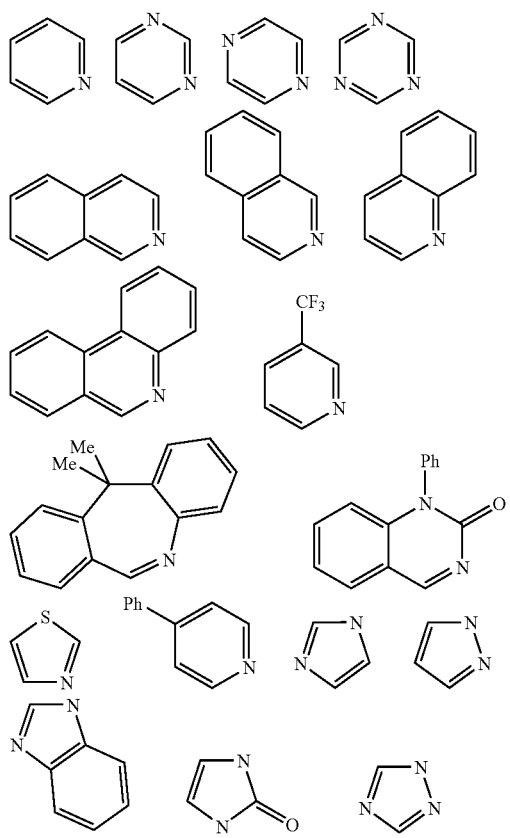

In Formula (PH2-2), the gallium bond to the nitrogen of one heterocycle is an ionic bond. An ionic bond is an electrical attraction between two oppositely charged atoms or groups of atoms. In this case, the metal is positively charged and one nitrogen of one heterocycle is negatively charged and the gallium and this nitrogen are bonded together. However, it should be understood that this bond could have some covalent character, depending on the particular metal and heterocycle. By way of example, a deprotonated imidazole would be capable of forming an ionic bond of this type with the metal.

In Formula (PH2-2), the gallium bond to the nitrogen of the other heterocycle is dative. A dative bond (also called a donor/acceptor bond) is a bond involving a shared pair of electrons in which both electrons come from the same atom, in this case, the nitrogen of the heterocycle. For example, a pyridine has a nitrogen with two unshared electrons that can be donated to the metal to form a dative bond.

In one aspect of the invention, the metal complex is represented by Formula (PH2-3).

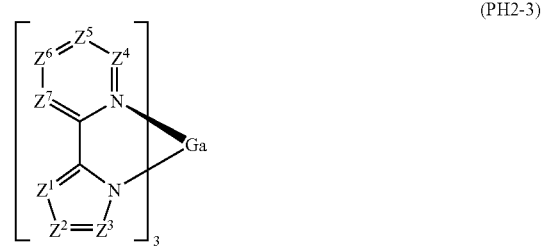

(PH2-3)

Each $Z^1$ through $Z^7$ represents N or C—Y. In one embodiment, no more than two, and desirably no more than one of $Z^1$ to $Z^3$ represent N. In another embodiment, no more than one of $Z^4$ to $Z^7$ represents N. Each Y represents hydrogen or an independently selected substituent. Examples of substituents include an alkyl group such as methyl group, an aromatic group such as a phenyl group, a cyano substituent, and a trifluoromethyl group. Two Y substituents can join to form a ring group, for example a fused benzene ring group. In one aspect of the invention, $Z^4$ through $Z^7$ represent C—Y.

Illustrative examples of organic gallium complexes of Formula (PH2-1) are given below.

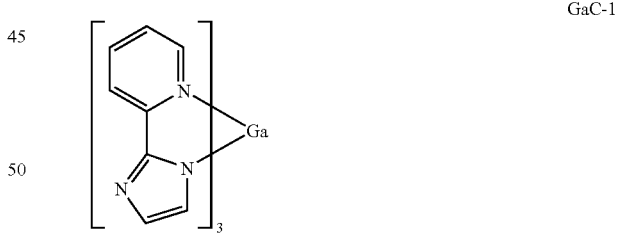

GaC-1

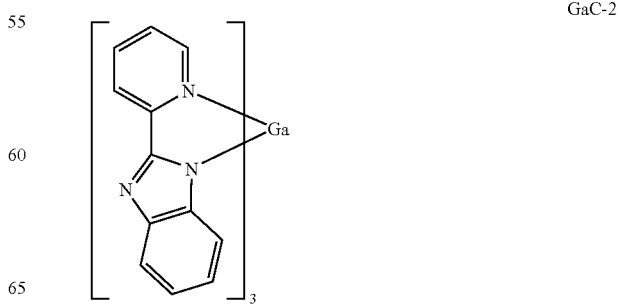

GaC-2

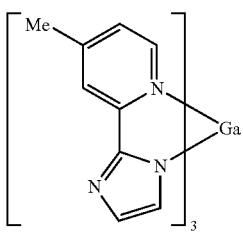
GaC-3

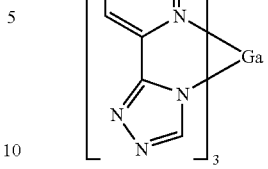
GaC-9

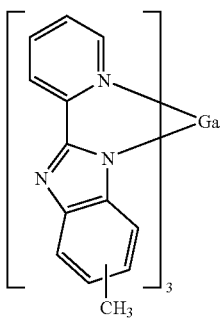
GaC-4

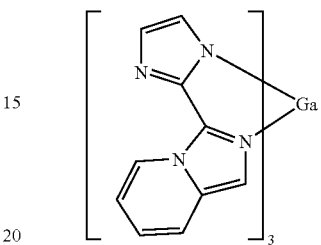
GaC-10

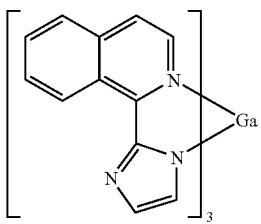
GaC-5

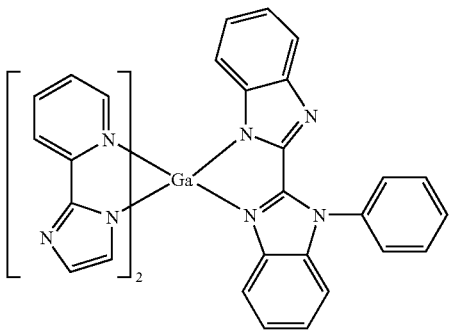
GaC-6

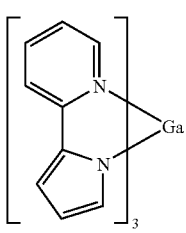
GaC-7

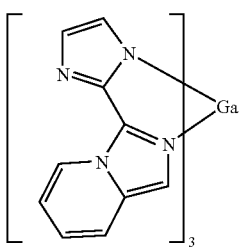
GaC-8

The organic gallium complexes of this invention are prepared as known in the art; for example, see US Application 2007/0003786 and U.S. Pat. No. 6,001,284.

Depending on the phosphorescent emitter, it is desirable for the gallium complex second host to be present at 40 vol. % or more of all the host materials present in the LEL. For yellow light emitters, preferred ranges are between 40 and 70%. For orange and red light emitters, preferred ranges are between 60 and 95%.

Embodiments of the invention can provide advantageous features such as operating efficiency, higher luminance, color hue, low drive voltage, and improved operating stability. Embodiments of the emissive compounds useful in the invention can provide a wide range of hues including those useful in the emission of white light (directly or through filters to provide multicolor displays).

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group can be halogen or can be bonded to the remainder of the molecule by an atom of carbon, silicon, oxygen, nitrogen, phosphorous, sulfur, selenium, or boron. The substituent can be, for example, halogen, such as chloro, bromo or fluoro; nitro; hydroxyl; cyano; carboxyl; or groups which can be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5- tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecyl-benzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which can be substituted and which contain a 3 to 7 membered heterocyclic ring composed of carbon atoms and at least one hetero atom selected from the group consisting of oxygen, nitrogen, sulfur or phosphorous, such as pyridyl, thienyl, furyl, azolyl, thiazolyl, oxazolyl, imidazolyl, pyrazolyl, pyrazinyl, pyrimidinyl, pyrolidinonyl, quinolinyl, isoquinolinyl, 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsiloxy.

If desired, the substituents can themselves be further substituted one or more times with the described substituent groups. The particular substituents used can be selected by those skilled in the art to attain desirable properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected.

For the purpose of this invention, also included in the definition of a heterocyclic ring are those rings that include coordinate or dative bonds. The definition of a coordinate bond can be found in Grant & Hackh's Chemical Dictionary, page 91. In essence, a coordinate bond is formed when electron rich atoms such as O or N, donate a pair of electrons to electron deficient atoms such as Al or B.

It is well within the skill of the art to determine whether a particular group is electron donating or electron accepting. The most common measure of electron donating and accepting properties is in terms of Hammett σ values. Hydrogen has a Hammett σ value of zero while electron donating groups have negative Hammett σ values and electron accepting groups have positive Hammett σ values. Lange's handbook of Chemistry, 12$^{th}$ Ed., McGraw Hill, 1979, Table 3-12, pp. 3-134 to 3-138, here incorporated by reference, lists Hammett α values for a large number of commonly encountered groups. Hammett α values are assigned based on phenyl ring substitution, but they provide a practical guide for qualitatively selecting electron donating and accepting groups.

Suitable electron donating groups can be selected from —R', —OR', and —NR'(R") where R' is a hydrocarbon containing up to 6 carbon atoms and R" is hydrogen or R'. Specific examples of electron donating groups include methyl, ethyl, phenyl, methoxy, ethoxy, phenoxy, —N(CH$_3$)$_2$, —N(CH$_2$CH$_3$)$_2$, —NHCH$_3$, —N(C$_6$H$_5$)$_2$, —N(CH$_3$)(C$_6$H$_5$), and —NHC$_6$H$_5$.

Suitable electron accepting groups can be selected from the group consisting of cyano, α-haloalkyl, α-haloalkoxy, amido, sulfonyl, carbonyl, carbonyloxy and oxycarbonyl substituents containing up to 10 carbon atoms. Specific examples include —CN, —F, —CF$_3$, —OCF$_3$, —CONHC$_6$H$_5$, —SO$_2$C$_5$, —COC$_6$H$_5$, —CO$_2$C$_6$H$_5$, and —OCOC$_6$H$_5$.

Unless otherwise specified, the term "percentage" or "percent" and the symbol "%" of a material indicates the volume percent of the material in the layer in which it is present.

The following describes typical design, materials and preparation of OLED devices.

General Device Architecture

The present invention can be employed in many OLED device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers can be employed as more fully described hereafter.

A typical structure, especially useful for of a small molecule device, is shown in the FIGURE and is comprised of a substrate 101, an anode 103, a hole-injecting layer 105, a hole-transporting layer 107, exciton-blocking layer, 108, a light-emitting layer 109, a blocking layer 110, an electron-transporting layer 111, and a cathode 113. These layers are described in detail below. Note that the substrate can alternatively be located adjacent to the cathode, or the substrate can actually constitute the anode or cathode. The organic layers between the anode and cathode are conveniently referred to as the organic EL element. Also, the total combined thickness of the organic layers is desirably less than 500 nm.

The anode and cathode of the OLED are connected to a voltage/current source 150 through electrical conductors 160. The OLED is operated by applying a potential between the anode and cathode such that the anode is at a more positive potential than the cathode. Holes are injected into the organic EL element from the anode and electrons are injected into the organic EL element at the cathode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678. OLED devices can also be electrically aged in direct current (DC) mode.

Substrate

The OLED device of this invention is typically provided over a supporting substrate 101 where either the cathode or anode can be in contact with the substrate. The substrate can be a complex structure comprising multiple layers of materials. This is typically the case for active matrix substrates wherein TFTs are provided below the OLED layers. It is still necessary that the substrate, at least in the emissive pixilated areas, be comprised of largely transparent materials. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support can be light transmissive, light absorbing or light reflective. Substrates for use in this case include, but are not limited to, glass, plastic, semiconductor materials, silicon, ceramics, and circuit board materials. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode, any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable methods such as evaporation, sputtering, chemical vapor deposition, or electrochemical procedures. Anodes can be patterned using well-known photolithographic processes. Optionally, anodes can be polished prior to application of other layers to reduce surface roughness so as to minimize shorts or enhance reflectivity.

Hole-Injecting Layer (HIL)

A hole-injecting layer 105 can be provided between the anode and the hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, some aromatic amines, for example, MTDATA (4,4',4"-tris[(3-methylphenyl)phenylaminotriphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1.

The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

It is usually advantageous to have a hole-transporting layer 107 deposited between the anode and the emissive layer. A hole-transporting material deposited in said hole-transporting layer between the anode and the light emitting layer can be the same or different from a hole-transporting compound used as the first host according to the invention or in exciton-blocking layer. The hole-transporting layer can optionally include a hole-injection layer. The hole-transporting layer can include more than one hole-transporting compound, deposited as a blend or divided into separate layers.

The hole-transporting layer contains at least one hole-transporting compound such as an aromatic tertiary arylamine, where the latter is understood to be a compound containing at least one trivalent nitrogen atom that is bonded only to carbon atoms, at least one of which is a member of an aromatic ring. The structures of the same hole-transporting materials useful as the first host can be useful in the HTL.

A more preferred class of aromatic tertiary amines for the HTL is those which include at least two aromatic tertiary amine moieties as described in U.S. Pat. Nos. 4,720,432 and 5,061,569. Such compounds include those represented by structural formula (HT1):

(HT1)

wherein $Q_1$ and $Q_2$ are independently selected aromatic tertiary amine moieties, and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (HT1) and containing two triarylamine moieties is represented by structural formula (HT2):

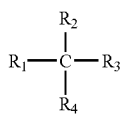

(HT2)

wherein

R₁ and R₂ each independently represents a hydrogen atom, an aryl group, or an alkyl group or R₁ and R₂ together represent the atoms completing a cycloalkyl group; and R₃ and R₄ each independently represents an aryl group, which is in turn substituted with a diaryl substituted amino group, as indicated by structural formula (HT3):

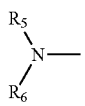

(HT3)

wherein

R₅ and R₆ are independently selected aryl groups. In one embodiment, at least one of R₅ or R₆ contains a polycyclic fused ring structure, e.g., a naphthalene.

The various alkyl, alkylene, aryl, and arylene moieties of the foregoing structural formulae (HT1), (HT2) and (HT3) can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, such as cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one can employ a triarylamine, such as a triarylamine satisfying the formula (HT2), in combination with a tetraaryldiamine.

Another class of useful hole-transporting materials includes polycyclic aromatic compounds as described in EP 1 009 041. Some hole-injecting materials described in EP 0 891 121 A1 and EP 1 029 909 A1, can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxythiophene)/poly(4-styrenesulfonate) also called PEDOT/PSS.

Exciton-Blocking Layer

An OLED device according to the invention can include one or more exciton-blocking layers, 108, placed adjacent to the light-emitting layer 109 on the anode side, to help confine triplet excitons to the light-emitting layer. For the exciton-blocking layer to be capable of confining triplet excitons, the material or materials of this layer should have triplet energies that exceed that of the phosphorescent emitter. If the triplet energy level of any material in the layer adjacent the light emitting layer is lower than that of the phosphorescent emitter, often that material will quench excited states in the light emitting layer, decreasing device luminous efficiency. In a preferred embodiment, the exciton blocking layer also helps to confine electron-hole recombination events to the light-emitting layer by blocking the escape of electrons from the light-emitting layer into the exciton-blocking layer, i.e. LUMO (Lowest Unoccupied Molecular Orbital) of the exciton/electron blocking material is greater than that of the host material in the light emitting layer by at least 0.2 eV. In an embodiment wherein the host comprises a mixture of host materials, the LUMO energy level of the exciton block should be greater by at least 0.2 eV than that of the co-host material having the lowest LUMO energy level in order to have the preferred electron-blocking property. (LUMO of the EBL material is less negative).

The exciton-blocking layer is often between 1 and 500 nm thick and suitably between 10 and 300 nm thick. Thicknesses in this range are relatively easy to control in manufacturing. In addition to having high triplet energy, the exciton-blocking layer 108 must be capable of transporting holes to the light-emitting layer 109. Exciton-blocking layer 108 can be used alone or with a hole-transporting layer 107. The exciton-blocking layer can include more than one compound, deposited as a blend or divided into separate layers. In an embodiment wherein a hole-transporting compound is used as a host or co-host, a hole transporting material deposited in the exciton-blocking layer between the anode and the light-emitting layer can be the same or different from the hole-transporting compound used as a host or co-host.

In a preferred embodiment the triplet energy of the exciton-blocking materials should not be lower than 2.1 eV and preferably 2.5 eV or greater. To meet the triplet energy requirement of 2.5 eV or greater, exciton-blocking compounds should not contain aromatic hydrocarbon fused rings (e.g., a naphthalene group).

One class of suitable exciton-blocking materials are tertiary arylamines including any of those of formula PH1-1 to PH1-5 provided that their triplet energy exceeds that of the phosphorescent material. Also suitable are compounds containing one or more triarylamine groups, such as those according to formula (HT3), provided that their triplet energy exceeds that of the phosphorescent material.

The substituted triarylamines that function as the exciton blocking material in the present invention can be selected from compounds having the chemical formula (EBF-1):

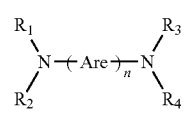

(EBF-1)

In formula (EBF-1), Are is independently selected from alkyl, substituted alkyl, aryl, or substituted aryl group;
R₁ -R₄ are independently selected aryl groups;
n is an integer of from 1 to 4.

Example materials useful in the exciton-blocking layer 108 include, but are not limited to:
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(3-methylphenyl)-N-phenylamino]biphenyl (TPD);
4,4'-Bis-diphenylamino-terphenyl;
2,6,2',6'-tetramethyl-N,N,N',N'-tetraphenyl-benzidine;
2,2'-dimethyl-N,N,N',N'-tetrakis(4-methylphenyl)-1,1'-biphenyl-4,4'-diamine;
4,4',4''-tris[(3-methylphenyl)phenylamino]triphenylamine (MTDATA);
4,4',4''-tris(N,N-diphenyl-amino)triphenylamine (TDATA); and N,N-bis[2,5-dimethyl-4-[(3-methylphenyl)phenylamino] phenyl]-2,5-dimethyl-N'-(3-methylphenyl)-N'-phenyl-1,4-benzenediamine.

In one desirable embodiment the material in the exciton-blocking layer is selected from formula (EBF-2):

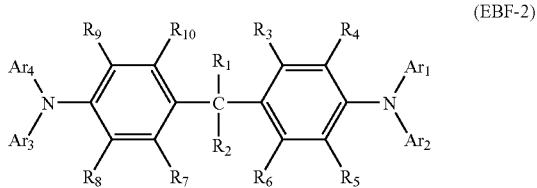

(EBF-2)

In formula (EBF-2), $R_1$ and $R_2$ represent substituents, provided that $R_1$ and $R_2$ can join to form a ring. For example, $R_1$ and $R_2$ can be methyl groups or join to form a cyclohexyl ring. $Ar_1$-$Ar_4$ represent independently selected aromatic groups, for example phenyl groups or tolyl groups. $R_3$—$R_{10}$ independently represent hydrogen, alkyl, substituted alkyl, aryl, substituted aryl group. In one desirable embodiment, $R_1$—$R_2$, $Ar_1$-$Ar_4$ and $R_3$—$R_{10}$ do not contain fused aromatic rings.

Some non-limiting examples of such materials are:
1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl](4-methylpenyl)methane;
Bis[4-(N,N-diethylamino)-2-methylphenyl](4-methylphenyl)ethane;
4-(4-Diethylaminophenyl)triphenylmethane; and
4,4'-Bis(4-diethylaminophenyl)diphenylmethane.

In one suitable embodiment the exciton-blocking material comprises a material of formula (EBF-3):

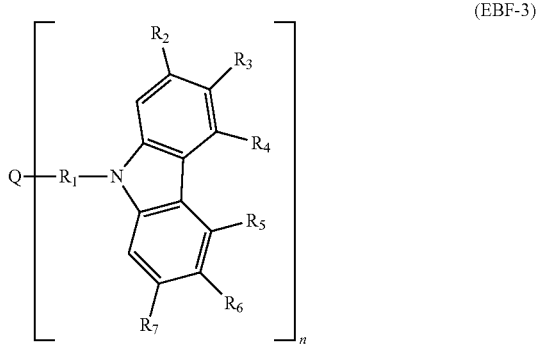

(EBF-3)

wherein n is an integer from 1 to 4;
Q is N, C, aryl, or substituted aryl group;
$R_1$ is phenyl, substituted phenyl, biphenyl, substituted biphenyl, aryl or substituted aryl;
$R_2$ through $R_7$ are independently hydrogen, alkyl, phenyl or substituted phenyl, aryl amine, carbazole, or substituted carbazole; provided that $R_2$—$R_7$ do not contain aromatic hydrocarbon fused rings.

Some non-limiting examples of such materials are:
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine; and
9,9'-[5'-[4-(9H-carbazol-9-yl)phenyl][1,1':3',1"-terphenyl]-4,4"-diyl]bis -9H-carbazole.

In one suitable embodiment the exciton blocking material comprises a material of formula (EBF-4):

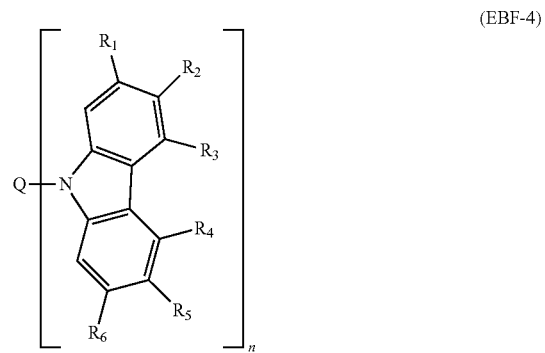

(EBF-4)

wherein n is an integer from 1 to 4;
Q is phenyl, substituted phenyl, biphenyl, substituted biphenyl, aryl, or substituted aryl group;
$R_1$ through $R_6$ are independently hydrogen, alkyl, phenyl or substituted phenyl, aryl amine, carbazole, or substituted carbazole;
provided that $R_1$—$R_6$ do not contain aromatic hydrocarbon fused rings.

Non-limiting examples of suitable materials are:
9,9'-(2,2'-dimethyl[1,1'-biphenyl]-4,4'-diyl)bis-9H-carbazole (CDBP);
9,9'-[1,1'-biphenyl]-4,4'-diyl)bis-9H-carbazole (CBP);
9,9'-(1,3-phenylene)bis-9H-carbazole (mCP);
9,9'-(1,4-phenylene)bis-9H-carbazole;
9,9',9"-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine; and
9-[4-(9H-carbazol-9-yl)phenyl]-N,N,N',N'-tetraphenyl-9H-carbazole-3,6-diamine;
9-phenyl-9H-carbazol.

Another exciton- and hole-blocking layer can be placed adjacent the LEL on the cathode side. Various materials can serve as exciton/hole-blocking layers there as long as they have the desired triplet energies, transport electrons, and have hole-blocking properties. Suitable exciton-blocking materials are described in WO 00/70655 and WO 01/93642. Two examples of useful materials are bathocuproine (BCP) and bis(2-methyl-8-quinolinolato)(4-phenylphenolato)Aluminum(III) (BAlQ), which is a preferred exciton/hole-blocking material, and others according to formula (PHF-7). Metal complexes other than BAlQ are also known to block holes and excitons as described in US 2003/0068528. US 2003/0175553 describes the use of fac-tris(1-phenylpyrazolato-N,C 2)iridium(III) (Irppz) in an electron/exciton blocking layer.

HOMO and LUMO energies for any compound can be either experimentally determined using many types of well-known known techniques (see, for examples, U.S. Pat. Nos. 7,132,174B2, 7,128,982B2, US Application 2006/0246315 or U.S. Pat. No. 7,045,952B2) or can be calculated. If possible, the HOMO and LUMO energies of a compound should be experimentally determined for this invention. When comparing energy levels of two materials, for example the LUMO energy levels of the exciton blocking layer and the host material, it is important to use estimated energy levels obtained by the same method for each. Two methods for estimating the HOMO energy level include measuring the ionization potential of the material by ultraviolet photoelectron spectroscopy and measuring the oxidation potential by an electrochemical technique such as cyclic voltammetry. The LUMO energy level can then be estimated by taking the optical band gap as the energy difference between LUMO and HOMO and then adding the optical band gap energy to the previously determined HOMO energy level. The relative LUMO energy levels of materials can also be estimated from reduction potentials of the materials measured in solution by an electrochemical technique such as cyclic voltammetry. The HOMO and LUMO energy data shown in the Tables for specific compounds were all experimental determined using the cyclic voltammetry method unless otherwise noted.

However, if the energies cannot be measured, the calculated values can be used. The calculated HOMO and LUMO energies for a molecule can be derived from the raw orbital energies of Density Functional Theory calculations given in eV. These raw HOMO and LUMO orbital energies ($E_{Hraw}$ and $E_{Lraw}$ respectively) are modified by empirically derived constants whose values were obtained by comparing the computed raw energies to experimental orbital energies obtained from electrochemical data, so that the HOMO and LUMO energies are given by equations 1 and 2:

$$HOMO = 0.643*(E_{Hraw}) - 2.13 \quad \text{(eq. 1)}$$

$$LUMO = 0.827*(E_{Lraw}) - 1.09 \quad \text{(eq. 2)}$$

$E_{Hraw}$ is the energy of the highest-energy occupied molecular orbital, and $E_{Lraw}$ is the energy of the lowest-energy unoccupied molecular orbital, both values expressed in eV. Values of $E_{Hraw}$ and $E_{Lraw}$ are obtained using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential can be used. MIDI!, 6-31G* and LANL2DZ are used as implemented in the Gaussian98 computer code and LACV3P is used as implemented in the Jaguar 4.1 (Schrodinger, Inc., Portland Oreg.) computer code. For polymeric or oligomeric materials, it is sufficient to compute $E_{Hraw}$ and $E_{Lraw}$ over a monomer or oligomer of sufficient size so that additional units do not substantially change the values of $E_{Hraw}$ and $E_{Lraw}$. It should be noted that the calculated energy values can typically show some deviation from the experimental values.

Because the molecular orbitals energies cannot be either calculated or measured accurately in some situations, differences of less than 0.05 should be considered equal for the purposes of this invention.

Light-Emitting Layer (LEL)

The LEL of the invention contains a yellow, orange or red light-emitting phosphorescent compound, a tertiary arylamine as a first host and a gallium complex with nitrogen bidentate ligands as the second host. However, other LELs can be present and are described as follows.

Suitably, another light-emitting layer of the OLED device comprises one or more host materials and one or more guest materials for emitting light. At least one of the guest materials is suitably a fluorescent or phosphorescent material. The light-emitting guest material(s) is usually present in an amount less than the amount of host materials and is typically present in an amount of up to 20 wt. % of the host, more typically from 0. 1-10 wt. % of the host. For convenience, the light-emitting guest material can be referred to as a light emitting dopant. A phosphorescent guest material can be referred to herein as a phosphorescent material, or phosphorescent dopant. The phosphorescent material is preferably a low molecular weight compound, but it can also be an oligomer or a polymer. It can be provided as a discrete material dispersed in the host material, or it can be bonded in some way to the host material, for example, covalently bonded into a polymeric host.

Fluorescent materials can be used in the same layer as the phosphorescent material, in adjacent layers, in adjacent pixels, or any combination. Care must be taken to select materials that will not adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

Materials for Phosphorescent Layers: Suitable host materials have a triplet energy (the difference in energy between the lowest triplet excited state and the singlet ground state of the host) that is greater than or equal to the triplet energy of the phosphorescent emitter. This energy level state is necessary so that triplet excitons are transferred to the phosphorescent emitter molecules and any triplet excitons formed directly on the phosphorescent emitter molecules remain there until emission occurs. However, efficient emission from devices in which the host material has a lower triplet energy than the phosphorescent emitter is still possible in some cases as reported by C. Adachi, et al, Appl. Phys. Lett., 79 2082-2084 (2001). Triplet energy is conveniently measured by any of several ways, as discussed for instance in S. L. Murov, I. Carmichael, and G. L. Hug, *Handbook of Photochemisty*, 2nd ed. (Marcel Dekker, New York, 1993).

In the absence of experimental data the triplet energies can be estimated in the following manner. The triplet state energy for a molecule is defined as the difference between the ground state energy (E(gs)) of the molecule and the energy of the lowest triplet state (E(ts)) of the molecule, both given in eV. These energies can be calculated using the B3LYP method as implemented in the Gaussian98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential can be used. MIDI!, 6-31G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by Equation 3 to give the triplet state energy (E(t)):

$$E(t) = 0.84*(E(ts) - E(gs)) + 0.35 \quad \text{(eq 3)}$$

For polymeric or oligomeric materials, it is sufficient to compute the triplet energy over a monomer or oligomer of sufficient size so that additional units do not substantially change the computed triplet energy of the material.

The following is a listing of triplet, HOMO and LUMO energies for some representative materials:

| Identifier | Triplet Energy | HOMO | LUMO | Structure |
|---|---|---|---|---|
| Ir(1-piq)$_3$ | 2.12 | −5.24 | −2.63 | |
| Ir(ppy)$_3$ | 2.54 | −5.27 | −2.10 | |
| YFD-1 | 2.36 | −5.45 | −2.33 | |
| NPB | 2.50 | −5.19 | −2.06 | |

-continued
| Identifier | Triplet Energy | HOMO | LUMO | Structure |
|---|---|---|---|---|
| CBP | 2.67 | −5.58 | −2.13 | 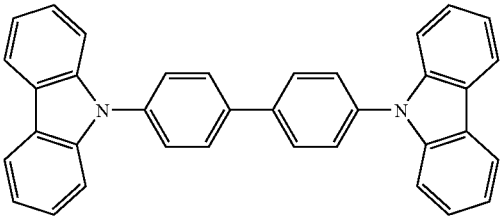 |
| mCP | 3.15 | −5.68 | −1.75 | 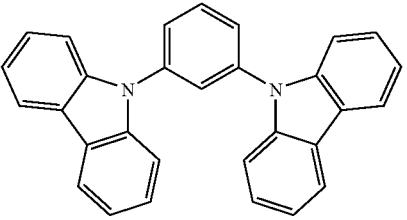 |
| TAPC | 2.95 | −5.15 | −1.30 | 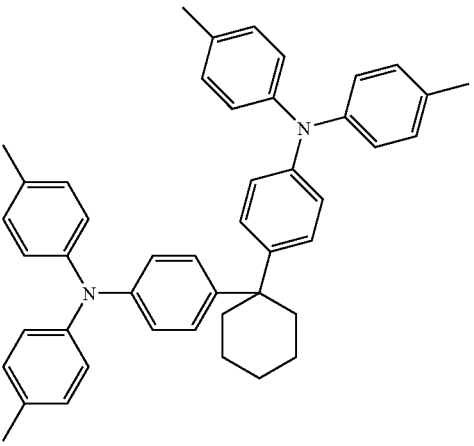 |
| MTDATA | 2.65 | −4.93 | −1.51 | 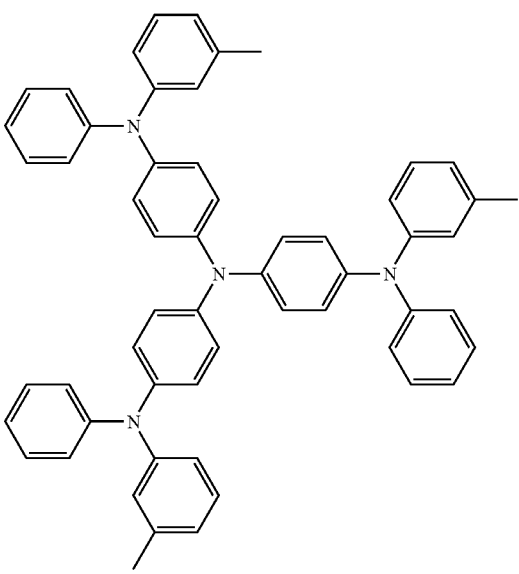 |

-continued

| Identifier | Triplet Energy | HOMO | LUMO | Structure |
|---|---|---|---|---|
| TCTA | 2.85 | −5.43 | −1.88 | |
| GaC-1 | 2.57 | −5.63 | −2.42 | |
| GaC-2 | 2.43 | −5.69 | −2.69 | |
| BAlq | 2.25 | −5.50 | −2.53 | |

| Identifier | Triplet Energy | HOMO | LUMO | Structure |
|---|---|---|---|---|
| BCP | 2.61 | −5.24 | −2.63 | 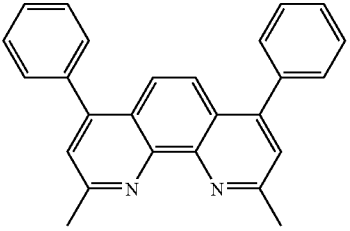 |

Desirable host materials are capable of forming a continuous film. The light-emitting layer can contain more than one host material in order to improve the device's film morphology, electrical properties, light emission efficiency, and lifetime. Suitable host materials are described in WO 00/70655; WO 01/39234; WO 01/93642; WO 02/074015; WO 02/15645, and US 2002/0117662.

Types of triplet host materials can be categorized according to their charge transport properties. The two major types are those that are predominantly electron-transporting and those that are predominantly hole-transporting. It should be noted that some host materials which can be categorized as transporting dominantly one type of charge, can transport both types of charges, especially in certain device structures, for example CBP which is described in C. Adachi, R. Kwong, and S. R. Forrest, *Organic Electronics*, 2, 37-43 (2001). Another type of host are those having a wide energy gap between the HOMO and LUMO such that they do not readily transport charges of either type and instead rely on charge injection directly into the phosphorescent dopant molecules.

A desirable electron transporting host can be any suitable electron transporting compound, such as benzazole, phenanthroline, 1,3,4-oxadiazole, triazole, triazine, or triarylborane, as long as it has a triplet energy that is higher than that of the phosphorescent emitter to be employed.

A preferred class of benzazoles is described by Jianmin Shi et al. in U.S. Pat. Nos. 5,645,948 and 5,766,779. Such compounds are represented by structural formula (PHF-1):

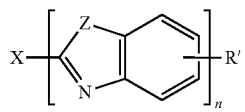
(PHF-1)

In formula (PHF-1), n is selected from 2 to 8;
Z is independently O, NR or S;
R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring; and
X is a linkage unit consisting of carbon, alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole] (TPBI) represented by a formula (PHF-2) shown below:

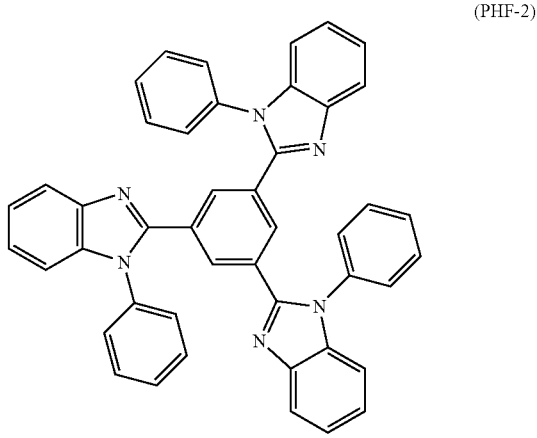
(PHF-2)

Another class of the electron transporting materials suitable for use as a host includes various substituted phenanthrolines as represented by formula (PHF-3):

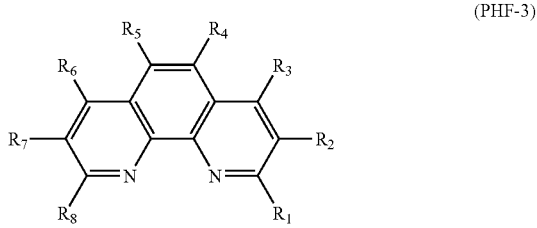
(PHF-3)

In formula (PHF-3), $R_1$—$R_8$ are independently hydrogen, alkyl group, aryl or substituted aryl group, and at least one of $R_1$—$R_8$ is aryl group or substituted aryl group.

Examples of suitable materials are 2,9-dimethyl-4,7-diphenyl-phenanthroline (BCP) (see formula (PH-1)) and 4,7-diphenyl-1,10-phenanthroline (Bphen) (see formula (PH-2)).

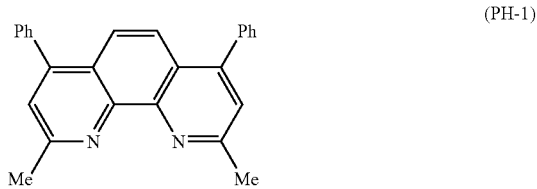
(PH-1)

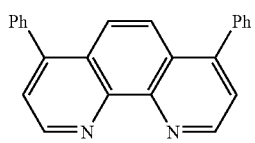
(PH-2)

A triarylboranes that functions as an electron transporting host can be selected from compounds having the chemical formula (PHF-4):

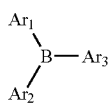
(PHF-4)

wherein

Ar$_1$ to Ar$_3$ are independently an aromatic hydrocarbocyclic group or an aromatic heterocyclic group which can have one or more substituent. It is preferable that compounds having the above structure are selected from formula (PHF-5):

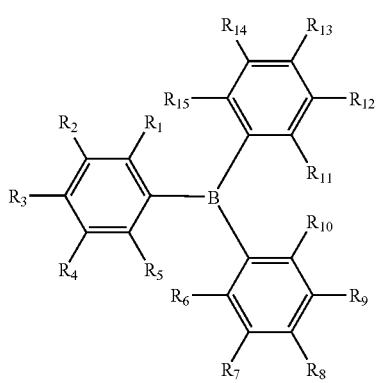
(PHF-5)

wherein R$_1$—R$_{15}$ are independently hydrogen, fluoro, cyano, trifluoromethyl, sulfonyl, alkyl, aryl or substituted aryl group.

Specific representative embodiments of the triarylboranes include:

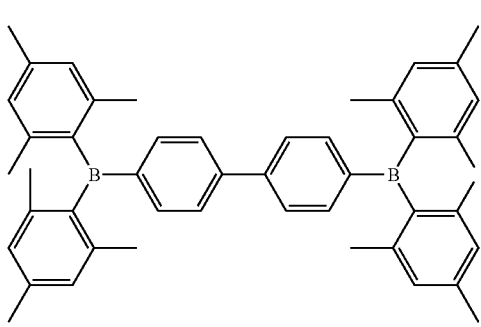
(PH-3)

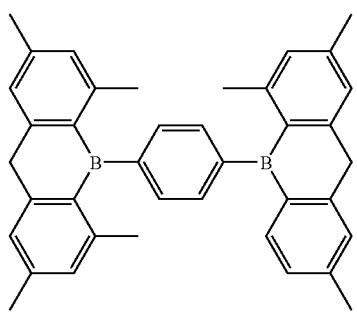
(PH-4)

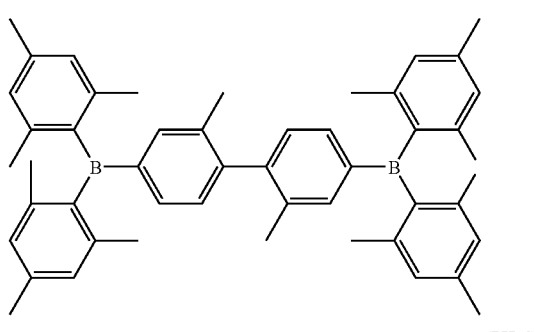
(PH-5)

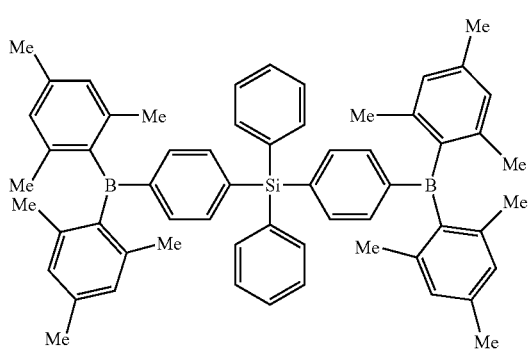
(PH-6)

An electron transporting host can be selected from substituted 1,3,4-oxadiazoles. Illustrative of the useful substituted oxadiazoles are the following:

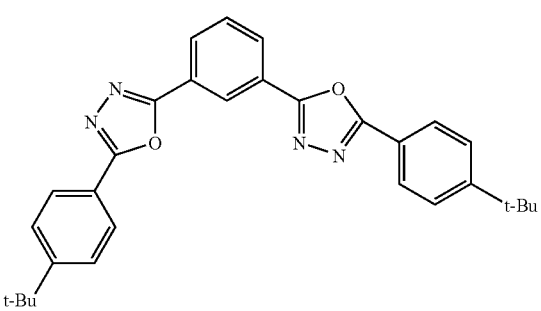
(PH-8)

An electron transporting host can be selected from substituted 1,2,4-triazoles. An example of a useful triazole is 3-phenyl-4-(1-naphtyl)-5-phenyl-1,2,4-triazole represented by formula (PHF-6):

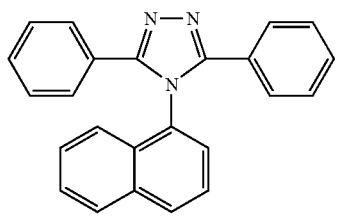
(PHF-6)

The electron transporting host can be selected from substituted
1,3,5-triazines. Examples of suitable materials are:
2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4',6,61-tetraphenyl-2,2'-bi-1,3,5-triazine; and
2,4,6-tris([1,1':3',1"-terphenyl]-5'-yl)-1,3,5-triazine.

In one embodiment, a suitable host material is an aluminum or gallium complex. Particularly useful host materials are represented by Formula (PHF-7).

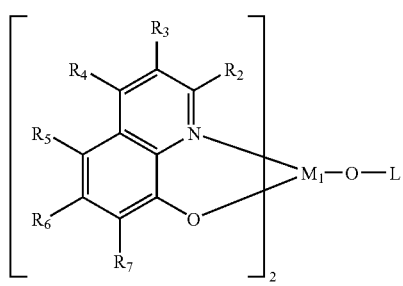
(PHF-7)

In Formula (PHF-7), $M_1$ represents Al or Ga. $R_2$—$R_7$ represent hydrogen or an independently selected substituent. Desirably, $R_2$ represents an electron-donating group, such as a methyl group. Suitably, $R_3$ and $R_4$ each independently represent hydrogen or an electron donating substituent. Preferably, $R_5$, $R_6$, and $R_7$ each independently represent hydrogen or an electron-accepting group. Adjacent substituents, $R_2$—$R_7$, can combine to form a ring group. L is an aromatic moiety linked to the aluminum by oxygen, which can be substituted with substituent groups such that L has from 6 to 30 carbon atoms. Illustrative examples of Formula (PHF-7) materials are listed below.

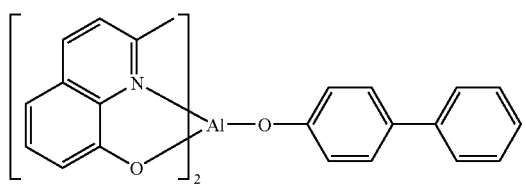
(PH-9)

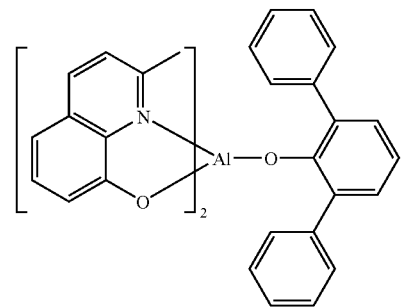
(PH-10)

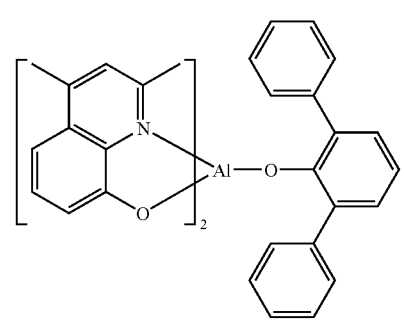
(PH-11)

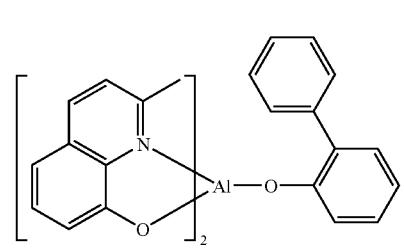
(PH-12)

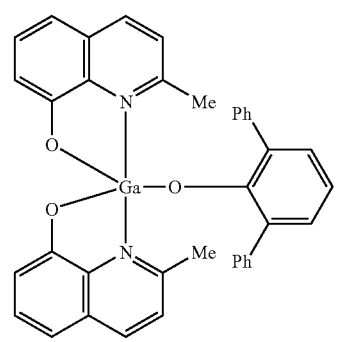
(PH-13)

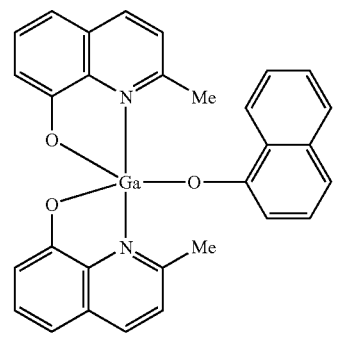
(PH-14)

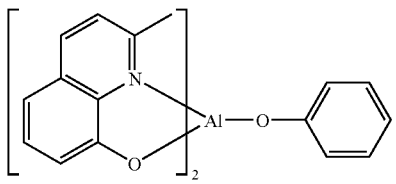
(PH-15)

A desirable hole-transporting host can be any suitable hole-transporting compound, such as a triarylamine or a carbazole, as long it has a triplet energy higher than that of the phosphorescent emitter to be employed.

Host materials which are electron-transporting or hole-transporting with some electron transporting properties, such as carbazoles, are generally more desirable when used as a single host material. This is especially true for typical phosphorescent dopants that are hole-trapping or capable of accepting injected holes. Less preferable are host materials which are primarily hole-transporting and have little electron-transporting properties, such as triarlyamines. Injecting electrons into these latter hole-transporting hosts can be difficult because of their relatively high LUMO energies.

Host materials can comprise a mixture of two or more host materials. Particularly useful is a mixture comprising at least one each of an electron-transporting and a hole-transporting co-host. The optimum concentration of the hole-transporting co-host(s) can be determined by experimentation and can be within the range 10 to 70 weight % of the total of the hole- and electron-transporting co-host materials in the light-emitting layer, and is often found to be in the range 15 to 40 wt. %. It is further noted that electron-transporting molecules and hole-transporting molecules can be covalently joined together to form single host molecules having both electron-transporting and hole-transporting properties.

A wide energy gap host material can be any suitable compound having a large HOMO-LUMO gap such that the HOMO and LUMO of the phosphorescent emissive material are within the HOMO and LUMO for the host. In this case, the phosphorescent emissive material acts as the primary charge carrier for both electrons and holes, as well as the site for the trapping of excitons. Often the phosphorescent dopants for use with the wide energy gap hosts are selected to have electron-withdrawing substituents to facilitate electron injection. The "wide energy gap" host material functions as a non-charge carrying material in the system. Such a combination can lead to high operation voltage of the device, as the concentration of the charge-carrying dopant is typically below 15% in the emissive layer.

Thompson et al. disclosed in US 2004/0209115 and US 2004/0209116 a group of wide energy gap hosts having triplet energies suitable for blue phosphorescent OLEDs. Such compounds include those represented by structural formula (PHF-12):

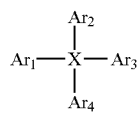
(PHF-12)

wherein:

X is Si or Pb; $Ar_1$, $Ar_2$, $Ar_3$ and $Ar_4$ are each an aromatic group independently selected from phenyl and high triplet energy heterocyclic groups such as, for example, pyridine, pyrazole or thiophene. It is believed that the HOMO-LUMO gaps in these materials is large due to the electronically isolated aromatic units, and the lack of any conjugating substituents.

Illustrative examples of this type of hosts include:

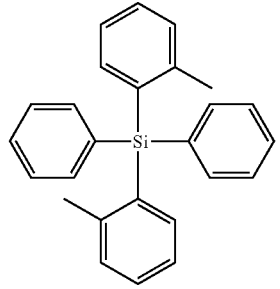
(PH-16)

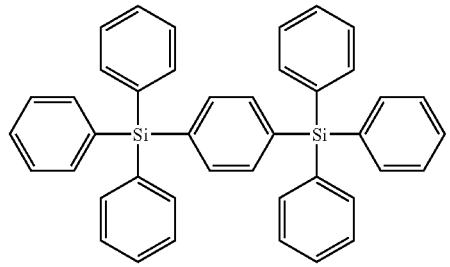
(PH-17)

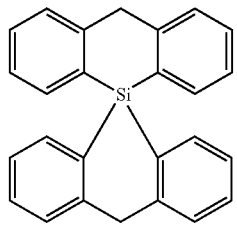
(PH-18)

Phosphorescent materials can be used singly or in combination with other phosphorescent materials, either in the same or different layers. Some other phosphorescent materials are described in WO 00/57676, WO 00/70655, WO 01/41512, WO 02/15645, US 2003/0017361, WO 01/93642, WO 01/39234, U.S. Pat. No. 6,458,475, WO 02/071813, U.S. Pat. No. 6,573,651, US 2002/0197511, WO 02/074015, U.S. Pat. No. 6,451,455, US 2003/0072964, US 2003/0068528, U.S. Pat. Nos. 6,413,656, 6,515,298, 6,451,415, 6,097,147, US 2003/0124381, US 2003/0059646, US 2003/0054198, EP 1 239 526, EP 1 238 981, EP 1 244 155, US 2002/0100906, US 2003/0068526, US 2003/0068535, JP 2003073387, JP 2003073388, US 2003/0141809, US 2003/0040627, JP 2003059667, JP 2003073665, and US 2002/0121638.

In many known hosts and device architectures for phosphorescent OLEDs, the optimum concentration of the phosphorescent dopant for luminous efficiency is found to be about 1 to 20 vol % and often 6 to 8 vol. % relative to the host material. However, in this invention, wherein the host comprises at least one gallium electron-transporting co-host (the second host) and at least one hole-transporting co-host (the first host) in the light-emitting layer, a phosphorescent material concentration from about 4 to 20% by volume, preferably 6 to 16% by volume provides high luminous efficiencies.

The emission wavelengths of cyclometallated Ir(III) complexes of the type $IrL_3$ and $IrL_2L'$, such as the green-emitting fac-tris(2-phenylpyridinato-N,C$^{2'}$)Iridium(III) (Ir(ppy)$_3$) and bis(2-phenylpyridinato-N,C$^{2'}$)Iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N, C$^{3'}$)Iridium(III)(acetylacetonate) and tris(2-phenylisoquinolinato-N,C)Iridium(III). A blue-emitting example is bis(2-(4, 6-diflourophenyl)-pyridinato-N,C$^{2'}$)Iridium(III)(picolinate).

Red electrophosphorescence has been reported, using bis (2-(2'-benzo[4,5-a]thienyl)pyridinato-N, C$^3$) iridium (acetylacetonate) [Btp$_2$Ir(acac)] as the phosphorescent material (Adachi, C., Lamansky, S., Baldo, M. A., Kwong, R. C., Thompson, M. E., and Forrest, S. R., App. Phys. Lett., 78, 1622-1624 (2001).

Other important phosphorescent materials include cyclometallated Pt(II) complexes such as cis-bis(2-phenylpyridinato-N,C$^{2'}$)platinum(II), cis-bis(2-(2'-thienyl)pyridinato-N, C$^{3'}$) platinum(II), cis-bis(2-(2'-thienyl)quinolinato-N,C$^{5'}$) platinum(II), or (2-(4,6-diflourophenyl)pyridinato-NC2') platinum (II) acetylacetonate. Pt(II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al, *Appl. Phys. Lett,* 65, 2124 (1994)).

One class of preferred phosphorescent emitters are those disclosed in US 2008/0020234. A specific example of a desirable yellow light emitting phosphorescent dopant is:

YPD-1

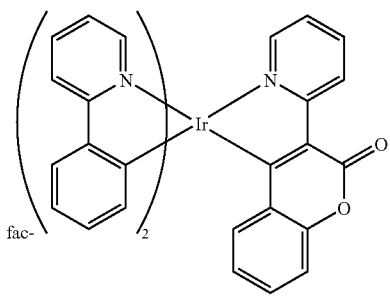

Hole-Blocking Layer

In some instances, an additional non-luminescent blocking layer 110 can be used directly adjacent to the light-emitting layer 109 on the cathode side. By non-luminescent, it is meant that the layer emits less than 10% of the total amount of light produced by the device. Most desirably, it emits no detectable amounts of light. Preferred materials for this application are the same as those described for exciton-blocking layers (EBL) as described above. This layer, when present, should also be in contact with an electron-transporting layer 111 as described below. It is desirable that material in such EBL would also have a hole-blocking properties in order to confine holes to the LEL, i.e. such material has a HOMO (Highest Occupied Molecular Orbital) at least 0.2 eV below (more negative) the HOMO levels of the hole-transporting co-host material in the mixed LEL or the HOMO level of the emitting dopant.

Electron-Transporting Layer (ETL)

The electron-transporting material deposited in said electron-transporting layer 111 between the cathode and the light emitting layer can include more than one electron transporting compound, deposited as a blend or divided into separate layers.

Preferred thin film-forming materials for use in constructing the electron-transporting layer of the organic EL devices of this invention are metal-chelated oxinoid compounds, including chelates of oxine itself (also commonly referred to as 8-quinolinol or 8-hydroxyquinoline). Such compounds help to inject and transport electrons, exhibiting high levels of performance, and are readily fabricated in the form of thin films. Exemplary of contemplated oxinoid compounds are those satisfying structural formula (ET1) below:

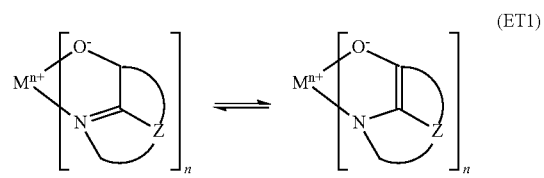

(ET1)

wherein
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III); Alq];
CO-2: Magnesium bisoxine [alias, bis(8-quinolinolato) magnesium(II)];
CO-3: Bis[benzo{f}-8-quinolinolato]zinc (II);
CO-4: Bis(2-methyl-8-quinolinolato)aluminum(III)-g-oxo-bis(2-methyl-8-quinolinolato)aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)];
CO-9: Zirconium oxine [alias, tetra(8-quinolinolato)zirconium(IV)].

Other electron transporting materials suitable for use in the electron-transporting layer include various butadiene derivatives as disclosed in U.S. Pat. No. 4,356,429 and various heterocyclic optical brighteners as described in U.S. Pat. No.

4,539,507. Benzazoles satisfying structural formula (ET2) are also useful electron transporting materials:

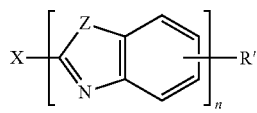

(ET2)

wherein n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and X is a linkage unit consisting of carbon, alkyl, aryl, substituted alkyl, or substituted aryl, which conjugately or unconjugately connects the multiple benzazoles together. An example of a useful benzazole is 2,2',2"-(1,3,5-phenylene)tris [1-phenyl-1H-benzimidazole] (TPBI) disclosed in Shi et al. in U.S. Pat. No. 5,766,779.

Other electron transporting materials suitable for use in the electron-transporting layer can be selected from anthracenes, napthacenes, alkali or alkaline earth metal complexes, triazines, triazoles, imidazoles, oxazoles, thiazoles and their derivatives, polybenzobisazoles, phenanthrolines, pyridine- and quinoline-based materials, cyano-containing polymers and perfluorinated materials.

The electron-transporting layer or a portion of the electron-transporting layer adjacent the cathode can further be doped with an alkali metal to reduce electron injection barriers and hence lower the drive voltage of the device. Suitable alkali metals for this purpose include lithium and cesium.

Cathode

When light emission is viewed solely through the anode 103, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with an organic layer (e.g., an electron transporting layer (ETL)) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, as disclosed in U.S. Pat. No. 6,013,384, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776, 622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,393. Cathode materials are typically deposited by any suitable methods such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants can be added to the hole-transporting layer, which can serve as a host. Multiple dopants can be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Pat. Nos. 5,683,823, 5,503,910, 5,405, 709, and 5,283,182, US 20020186214, US 20020025419, US 20040009367, and US 6627333.

Additional layers such as exciton, electron- and hole-blocking layers as taught in the art can be employed in devices of this invention. Hole-blocking layers are commonly used to improve efficiency of phosphorescent emitter devices, for example, as in US 20020015859, WO 00/70655A2, WO 01/93642A1, US 20030068528 and US 20030175553 A1

This invention can be used in so-called stacked or tandem device architecture, for example, as taught in U.S. Pat. Nos. 5,703,436 and 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimation "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimation boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

One preferred method for depositing the materials of the present invention is described in US 2004/0255857 and U.S.

Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784, 585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material can be evaporated using different source evaporators or the solid materials can be mixed prior to evaporation using the same source evaporator.

Encapsulation

Most OLED devices are sensitive to moisture or oxygen, or both, so they are commonly sealed in an inert atmosphere such as nitrogen or argon. In sealing an OLED device in an inert environment, a protective cover can be attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters in functional relationship with the light emitting areas of the display. Filters, polarizers, and anti-glare or anti-reflection coatings can also be provided over a cover or as part of a cover.

The OLED device can have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have ITO spacer layer placed between a reflective anode and the organic EL media, with a semitransparent cathode over the organic EL media.

EXAMPLES

Device Examples 1-1 through 1-6

Inventive OLED devices were constructed in the following manner:

1. A glass substrate, coated with an approximately 25 nm layer of indium-tin oxide (ITO) as the anode, was sequentially ultrasonicated in a commercial detergent, rinsed in deionized water, and exposed to an oxygen plasma for about 1 minute.
2. Over the ITO a 1 nm fluorocarbon ($CF_x$) hole injecting layer (HIL) was deposited by plasma-assisted deposition of $CHF_3$ as described in U.S. Pat. No. 6,208,075.
3. Next, a hole transporting layer (HTL) of NN'-di-1-naphthyl-N,N'-diphenyl-4,4'-diaminobiphenyl (NPB) was vacuum deposited to a thickness of 115 nm.
4. A 35 nm light emitting layer (LEL) consisting of a mixture of GaC-1 as the electron transporting co-host, NPB as the hole transporting co-host, and fac-tris(1-phenyl-isoquinolinato-N^C)Iridium(III) [i.e., Ir(1-piq)$_3$] as a red phosphorescent emitter was then vacuum deposited onto the HTL. Concentration of NPB was varied in the LEL; and the Ir(1-piq)$_3$ comprises 4 wt. % relative to the total of the co-host materials.
5. An electron transporting layer (ETL) of 2-phenyl-9,10-di(2-naphthyl)anthracene (PADN) having a thickness of 40 nm was vacuum deposited over the LEL.
6. An electron injection layer (EIL) of 4,7-diphenyl-1,10-phenanthroline (Bphen) having a thickness of 10 nm was vacuum deposited over the ETL.
7. 0.5 nm of lithium fluoride was vacuum deposited onto the EIL, followed by a 100 nm layer of aluminum, to form a bilayer cathode.

The above sequence completed the deposition of the devices. The devices, together with a desiccant, were then hermetically packaged in a dry glove box for protection against ambient environment. Thus, composition of the LEL in the inventive devices was as noted below:

Example 1-1: GaC-1 (86%), NPB (10%), and fr(1-piq)$_3$ (4%);

Example 1-2: GaC-1 (81%), NPB (15%), and Ir(1-piq)$_3$ (4%);

Example 1-3: GaC-1 (76%), NPB (20%), and Ir(1-piq)$_3$ (4%);

Example 1-4: GaC-1 (66%), NPB (30%), and Ir(1-piq)$_3$ (4%).

A comparative device 1-5 not satisfying the requirements of the invention was fabricated in an identical manner to device 1-1 except that NPB was not included in the LEL and GaC-1 was used as a single host for the red emitter. Thus, device 1-5 had the following structure of layers: ITO|$CF_x$ (1 nm)| NPB (115 nm)|GaC-1+4 wt. % Ir(-piq)$_3$ (35 nm)|PADN (40 nm)|Bphen (10 nm)|LiF|Al.

A comparative device 1-6 not satisfying the requirements of the invention was fabricated in an identical manner to device 1-5 except that Ir(-piq)$_3$ was present at 6 wt.% relative to a host material. Thus, device 1-6 had the following structure of layers: ITO|$CF_x$(1 nm)|NPB (115 nm)|GaC-1+6 wt.% Ir(-piq)$_3$ (35 nm)|PADN (40 nm)|Bphen (10 nm)|LiF|Al.

The devices thus formed were tested for efficiency and color at an constant current density of 2 mA/cm$^2$ and the results are reported in Table 1 in the form of luminous yield (cd/A), voltage (V), external quantum efficiency (EQE,%), power efficiency (lm/W), and CIE (Commission Internationale de l'Eclairage) coordinates.

TABLE 1

Evaluation results for devices 1-1 through 1-6.

| Device | % NPB in the LEL | Luminous yield, cd/A | Voltage V | Power eff, Lm/W | EQE, % | CIEx, CIEy | Example |
|---|---|---|---|---|---|---|---|
| 1-1 | 10 | 12.2 | 3.7 | 10.4 | 14.0 | 0.667; 0.332 | invention |
| 1-2 | 15 | 13.5 | 4.4 | 9.6 | 15.6 | 0.667; 0.331 | invention |
| 1-3 | 20 | 14.0 | 4.3 | 10.2 | 16.2 | 0.666; 0.330 | invention |
| 1-4 | 30 | 12.2 | 3.6 | 10.6 | 14.0 | 0.666; 0.330 | invention |
| 1-5 | 0 | 10.0 | 3.7 | 8.5 | 11.5 | 0.665; 0.332 | comparison |
| 1-6 | 0 | 10.4 | 3.8 | 8.6 | 12.6 | 0.669; 0.329 | comparison |

As can be seen from Table 1, device 1-1 through 1-4 incorporating GaC-1 and NPB materials as co-hosts in the LEL, according to the present invention, demonstrated higher luminous yield and external quantum efficiency (EQE) than the comparative devices with only GaC-1 as the host. It also should be noted that the triplet energies of both NPB (2.5 eV) and GaC-1 (2.57 eV) is greater than the triplet energy of Ir(-piq)$_3$ (2.12 eV).

The devices were aged electrically at room temperature in a standard square-wave AC mode (80 Hz, 50% duty cycle, −14 V reverse bias) at 20 mA/cm$^2$. Half-life (TSO) is the numbers of hours required for the luminance to drop by 50% of its initial value. Data are shown in Table 2.

TABLE 2

Operational half-lives of devices 1-1 through 1-5.

| Device | % NPB in the LEL | Half-life ($T_{50}$), hours | Example |
|---|---|---|---|
| 1-1 | 10 | 62 | invention |
| 1-2 | 15 | 80 | invention |
| 1-3 | 20 | 96 | invention |
| 1-4 | 30 | 177 | invention |
| 1-5 | 0 | 72 | comparison |

Inventive devices 1-2 through 1-4 incorporating the mixed LEL with NPB concentration above 10% demonstrated improvement of device lifetime compared to device 1-5 with only GaC-1 as the host.

Device Examples 2-1 through 2-4

A device 2-1 satisfying the requirements of the invention was constructed in the following manner:

1. A glass substrate, coated with an approximately 25 nm layer of indium-tin oxide (ITO) as the anode, was sequentially ultrasonicated in a commercial detergent, rinsed in deionized water, and exposed to an oxygen plasma for about 1 minute.
2. Over the ITO a 1 nm fluorocarbon (CF$_x$) hole injecting layer (HIL) was deposited by plasma-assisted deposition of CHF$_3$ as described in U.S. Pat. No. 6,208,075.
3. Next, a hole transporting layer of NPB was vacuum deposited to a thickness of 95 nm.
4. A 35 nm light emitting layer (LEL) consisting of a mixture of GaC-1 as the electron transporting co-host, NPB as the hole transporting co-host, and YPD-1 as a yellow phosphorescent emitter was then vacuum deposited onto the HTL. The NPB comprises 20 wt. % of the total of the co-host materials in the LEL, and the YPD-1 comprises 8 wt. % relative to the total of the co-host materials.
5. A blocking layer of bis(2-methylquinolin-8-olato) (2,6-diphenyl-phenolato) aluminum(III) (BAlq) having a thickness of 10 nm was vacuum deposited over the LEL.
6. An electron transporting layer (ETL) of of tris(8-quinolinolato) aluminum (III) (Alq) having a thickness of 40 nm was vacuum deposited over the blocking layer.
7. 0.5 nm of lithium fluoride as a electron injection layer was vacuum deposited onto the ETL, followed by a 100 nm layer of aluminum, to form a bilayer cathode.

The above sequence completed the deposition of the device. Therefore, device 2-1 had the following structure of layers: ITO|CF$_x$(1 nm)| NPB (95 nm)|GaC-1+20 wt. % NPB+8 wt. % YPD-1 (35 nm)| BAlq (10 nm)|Alq (40 nm)|LiF|Al. The device, together with a desiccant, was then hermetically packaged in a dry glove box for protection against ambient environment.

An inventive device 2-2 was fabricated in an identical manner to 2-1 except for using 50 nm Bphen in place of Alq in the ETL. A blocking layer of BAlq was omitted. Thus, device 2-2 has the following structure of layers: ITO|CF$_x$ (1 nm)|NPB (95 nm)|GaC-1+20 wt. % NPB+8 wt. % YPD-1 (35 nm)|Bphen (50 nm)|LiF|Al.

A comparative device 2-3 not satisfying the requirements of the invention was fabricated in an identical manner to device 2-1 except that NPB was not included into the LEL. The device has the following structure: ITO|CF$_x$ (1 nm)|NPB (95 nm)|GaC-1+8 wt. % YPD-1 (35 nm)|BAlq (10 nm)|Alq (40 nm)|LiF|Al.

A comparative device 2-4 not satisfying the requirements of the invention was fabricated in an identical manner to device 2-2 except that NPB was not included into the LEL. The device has the following structure: ITO|CF$_x$(1 nm)|NPB (95 nm)|GaC-1+8 wt. % YPD-1 (35 nm)|Bphen (50 nm)|LiF|Al.

The devices thus formed were tested for efficiency and color at an constant current density of 1 mA/cm$^2$ and the results are reported in Table 3 in the form of luminous yield (cd/A), voltage V), power efficiency (lm/W), and CIE (Commission Internationale de l'Eclairage) coordinates.

TABLE 3

Evaluation results for devices 2-1 through 2-4.

| Device | % NPB in the LEL | Luminous yield, cd/A | Voltage V | Power eff, Lm/W | EQE, % | CIEx, CIEy | Example |
|---|---|---|---|---|---|---|---|
| 2-1 | 20 | 34.6 | 5.2 | 20.9 | 10.5 | 0.462; 0.530 | invention |
| 2-2 | 20 | 47.9 | 3.3 | 45.6 | 14.9 | 0.468; 0.526 | invention |
| 2-3 | 0 | 9.57 | 6.7 | 4.5 | 2.9 | 0.459; 0.529 | comparison |
| 2-4 | 0 | 16.1 | 3.4 | 14.9 | 5.1 | 0.469; 0.521 | comparison |

As can be seen from Table 3, inventive devices 2-1 and 2-2 incorporating GaC-1 and NPB materials as co-hosts in the mixed LEL according to the present invention provided higher luminous yield and lower drive voltage as compared to device 2-3 and 2-4 with a single host of GaC-1. It also should be noted that the triplet energies of both NPB (2.50) and GaC-1 (2.57) is greater than the triplet energy of YPD-1 (2.34 eV).

Devices 2-1 through 2-4 were electrically aged at a luminance level of 1000 cd/m$^2$ in direct current mode at room temperature. Half-lives ($T_{50}$) are reported in Table 4.

TABLE 4

Operational half-lives of devices 2-1 through 2-4.

| Device | % NPB in the LEL | Half-live ($T_{50}$), hours | Example |
|---|---|---|---|
| 2-1 | 20 | 240 | invention |
| 2-2 | 20 | 345 | invention |
| 2-3 | 0 | 140 | comparison |
| 2-4 | 0 | 55 | comparison |

Again, the inventive devices with mixed LEL show significant improvement of operational lifetime ($T_{50}$) relative to comparative devise with a single host.

Device Examples 3-1 through 3-7

Inventive devices 3-1 through 3-4 satisfying the requirements of the invention were constructed in the following manner:
1. A glass substrate, coated with an approximately 25 nm layer of indium-tin oxide (ITO) as the anode, was sequentially ultrasonicated in a commercial detergent, rinsed in deionized water, and exposed to an oxygen plasma for about 1 minute.
2. Over the ITO a 1 nm fluorocarbon ($CF_x$) hole injecting layer (HIL) was deposited by plasma-assisted deposition of $CHF_3$ as described in U.S. Pat. No. 6,208,075.
3. Next, another hole injecting layer (HIL2) of dipyrazino [2,3-f:2',3'-h]quinoxalinehexacarbonitrile (DQHC) was vacuum deposited to a thickness of 10 nm.
4. Next, a hole transporting layer of NPB was vacuum deposited to a thickness of 95 nm.
5. A 35 nm light emitting layer (LEL) consisting of a mixture of GaC-2 as the electron transporting co-host, NPB as the hole transporting co-host, and YPD-1 as a yellow phosphorescent emitter was then vacuum deposited onto the HTL. Concentration of NPB was varied in the LEL. The YPD-1 comprised 10 wt. % relative to the total of the co-host materials.
6. A blocking layer of GaC-2 having a thickness of 10 nm was vacuum deposited over the mixed LEL.
7. An ETL of PADN having a thickness of 30 nm was vacuum deposited over the ETL.
8. An EIL of Bphen having a thickness of 10 nm was vacuum deposited over the ETL.
9. 0.5 nm of lithium fluoride as a electron injection layer was vacuum deposited onto the EIL, followed by a 100 nm layer of aluminum, to form a bilayer cathode.

The above sequence completed the deposition of the devices. The devices, together with a desiccant, were then hermetically packaged in a dry glove box for protection against ambient environment. Thus, composition of the LEL in the inventive devices was as noted below:

Example 3-1: GaC-2 (70%), NPB (20%), and YPD-1 (10%);

Example 3-2: GaC-2 (60%), NPB (30%), and YPD-1 (10%);

Example 3-3: GaC-2 (50%), NPB (40%), and YPD-1 (10%);

Example 3-4: GaC-2 (40%), NPB (50%)7 and YPD-1 (10%).

A comparative device 3-5 not satisfying the requirements of the invention was fabricated in an identical manner to device 3-1 except that NPB was not included in the LEL and GaC-2 was used as a single host for the yellow emitter YPD-1.

An inventive device 3-6 satisfying the satisfying the requirements of the invention was fabricated in an identical manner to device 3-2 except that the YPD-1 comprised 14 wt. % relative to the total of the co-host materials. A blocking layer of GaC-2 was omitted and ETL consisted of 40 nm of PADN. The device 3-6 had the following structure of the layers: ITO|$CF_x$ (1 nm)|DQHC (10 nm)|NPB (95 nm)| GaC-2+30% NPB+14 wt. % YPD-1 (35 nm)|PADN (40 nm)|Bphen (10 nm)|LiF|Al.

A comparative device 3-7 not satisfying the requirements of the invention was fabricated in an identical manner to device 3-6 except that NPB was not included in the LEL. Device 3-7 had the following structure of layers: ITO|$CF_x$ (1 nm)|DQHC (10 nm)|NPB (95 nm)|GaC-2+14 wt. % YPD-1 (35 nm)|PADN (40 nm)|Bphen (10 nm)|LiF|Al.

The devices thus formed were tested for efficiency and color at an constant current density of 1 mA/Cm$^2$ and the results are reported in Table 5 in the form of luminous yield (cd/A), voltage (V), power efficiency (lm/W), and CIE (Commission Internationale de l'Eclairage) coordinates.

TABLE 5

Evaluation results for devices 3-1 through 3-7.

| Device | % NPB in the LEL | Luminous yield, cd/A | Voltage V | Power eff, Lm/W | EQE, % | CIEx, CIEy | Example |
|---|---|---|---|---|---|---|---|
| 3-1 | 20 | 13.5 | 5.2 | 8.2 | 4.2 | 0.470; 0.524 | invention |
| 3-2 | 30 | 13.8 | 5.1 | 8.5 | 4.3 | 0.469; 0.525 | invention |
| 3-3 | 40 | 14.4 | 5.1 | 8.9 | 4.5 | 0.467; 0.527 | invention |
| 3-4 | 50 | 15.7 | 5.0 | 9.9 | 4.8 | 0.465; 0.529 | invention |
| 3-5 | 0 | 12.4 | 6.4 | 6.1 | 3.9 | 0.474; 0.519 | comparison |
| 3-6 | 30 | 16.6 | 5.0 | 10.4 | 5.2 | 0.471; 0.523 | invention |
| 3-7 | 0 | 14.7 | 5.4 | 8.6 | 4.7 | 0.476; 0.518 | comparison |

As can be seen from Table 5, device 3-1 through 3-4 and device 3-6 incorporating GaC-2 and NPB materials as co-hosts in the LEL, according to the present invention, demonstrated higher luminous yield, power and quantum efficiencies than comparative devices with a neat GaC-2 host. It should also be noted that the HOMO of GaC-2 in the blocking layer of step 6 (−5.69) is greater than 0.2 more negative than either the HOMO of the tertiary arylamine first host (−5.19) or the HOMO of the phosphorescent emitter (−5.45) in the adjacent LEL.

Devices 3-1 through 3-7 were electrically aged at a luminance level of 1000 cd/M$^2$ in direct current mode at room temperature. Half-life (T$_{50}$) is shown in Table 6.

TABLE 6

Operational half-lives of devices 3-1 through 3-7.

| Device | % NPB in the LEL | Half-live (T$_{50}$), hours | Example |
|---|---|---|---|
| 3-1 | 20 | 317 | invention |
| 3-2 | 30 | 245 | invention |
| 3-3 | 40 | 247 | invention |
| 3-4 | 50 | 271 | invention |
| 3-5 | 0 | 76 | comparison |
| 3-6 | 30 | 387 | invention |
| 3-7 | 0 | 107 | comparison |

Thus, the yellow-emitting phosphorescent devices with mixed LEL showed significant improvements of luminous yield and power efficiency as well as operational lifetime compared to a single host OLEDs.

Device Examples 4-1 through 4-6

Inventive devices 4-1 through 4-5 satisfying the satisfying the requirements of the invention was fabricated in an identical manner to device 1-1 except that GaC-2 was used as electron transporting co-host in the mixed LEL. Concentration of NPB was varied in the LEL; and the composition of the LEL in the inventive devices was as noted below:

Example 4-1: GaC-2 (86%), NPB (10%), and Ir(1-piq)$_3$ (4%);

Example 4-2: GaC-2 (81%), NPB (15%), and Ir(1-piq)$_3$ (4%);

Example 4-3: GaC-2 (76%), NPB (20%), and Ir(1-piq)$_3$ (4%);

Example 4-4: GaC-2 (66%), NPB (30%), and Ir(1-piq)$_3$ (4%);

Example 4-5: GaC-2 (46%), NPB (50%), and Ir(1-piq)$_3$ (4%).

A comparative device 4-6 not satisfying the requirements of the invention was fabricated in an identical manner to device 4-1 except that NPB was not included in the LEL and GaC-2 was used as a single host for the red emitter. Thus, device 46 had the following structure of layers: ITO|CF$_x$ (1 nm)|NPB (115 nm)|GaC-2+4 wt. % Ir(-piq)$_3$ (35 nm)|PADN (40 nm)|Bphen (10 nm)|LiF|Al.

The devices thus formed were tested for efficiency and color at an constant current density of 2 rA/cm$^2$ and the results are reported in Table 7 in the form of luminous yield (cd/A), voltage (V), power efficiency (lm/W), and CIE (Commission Internationale de l'Eclairage) coordinates.

TABLE 7

Evaluation results for devices 4-1 through 4-6.

| Device | % NPB in the LEL | Luminous yield, cd/A | Voltage V | Power eff, Lm/W | EQE, % | CIEx, CIEy | Example |
|---|---|---|---|---|---|---|---|
| 4-1 | 10 | 6.8 | 6.2 | 3.5 | 9.3 | 0.674; 0.322 | invention |
| 4-2 | 15 | 5.9 | 6.0 | 3.0 | 8.1 | 0.671; 0.321 | invention |
| 4-3 | 20 | 6.2 | 5.9 | 3.3 | 8.3 | 0.670; 0.331 | invention |
| 4-4 | 30 | 5.4 | 5.8 | 2.9 | 7.2 | 0.667; 0.321 | invention |

TABLE 7-continued

Evaluation results for devices 4-1 through 4-6.

| Device | % NPB in the LEL | Luminous yield, cd/A | Voltage V | Power eff, Lm/W | EQE, % | CIEx, CIEy | Example |
|---|---|---|---|---|---|---|---|
| 4-5 | 50 | 5.5 | 5.7 | 3.0 | 7.3 | 0.661; 0.319 | invention |
| 4-6 | 0 | 8.5 | 6.6 | 4.0 | 11.9 | 0.677; 0.322 | comparison |

Devices 4-1 through 4-6 were electrically aged at 20 mA/cm² in direct current mode at room temperature. Observed $T_{50}$ are shown in Table 8.

TABLE 8

Operational half-lives of devices 4-1 through 4-6.

| Device | % NPB in the LEL | Half-live ($T_{50}$), hours | Example |
|---|---|---|---|
| 4-1 | 10 | 392 | invention |
| 4-2 | 15 | 461 | invention |
| 4-3 | 20 | 520 | invention |
| 4-4 | 30 | 869 | invention |
| 4-5 | 50 | 2319 | invention |
| 4-6 | 0 | 281 | comparison |

Thus, as can be seen from Table 7, addition of NPB into the LEL does not result in efficiency improvement, however, does reduce drive voltage and improves device lifetime.

Device Examples 5-1 through 54

A comparative device 5-1 not satisfying the satisfying the requirements of the invention was fabricated in the following manner:

1. A glass substrate, coated with an approximately 25 nm layer of indium-tin oxide (ITO) as the anode, was sequentially ultrasonicated in a commercial detergent, rinsed in deionized water, and exposed to an oxygen plasma for about 1 minute.
2. Over the ITO a 1 nm fluorocarbon ($CF_x$) hole injecting layer (HIL) was deposited by plasma-assisted deposition of $CHF_3$ as described in U.S. Pat. No. 6,208,075.
3. Next a HTL of NPB was vacuum deposited to a thickness of 95 nm.
4. An exciton/electron blocking layer (EBL) of 4,4',4"-tris (carbazolyl)-triphenylamine (TCTA) was vacuum deposited to a thickness of 10 nm.
5. A 35 nm light emitting layer (LEL) consisting of a GaC-1 as host, and tris(2-phenyl-pyridinato-N,C²')Iridium (III) [i.e., r(ppy)₃] as a green phosphorescent emitter was then vacuum deposited onto the EBL. Ir(Ppy)₃ comprises 6 wt. % relative to the host material.
6. A blocking layer of GaC-1 having a thickness of 5 nm was vacuum deposited over the LEL.
7. An ETL of GaC-2 having a thickness of 45 nm was vacuum deposited over the blocking layer.
8. 0.5 nm of lithium fluoride was vacuum deposited onto the ETL, followed by a 100 nm layer of aluminum, to form a bilayer cathode.

The above sequence completed the deposition of the device. Therefore, device 5-1 had the following structure of layers: ITO|$CF_x$ (1 nm)|NPB (95 nm)|TCTA (10 nm)|GaC-1+6 wt. % Ir(ppy)₃ (35 nm)|GaC-1 (5 nm)|GaC-2 (45 nm)|LiF|Al. The device, together with a desiccant, was then hermetically packaged in a dry glove box for protection against ambient environment.

A comparative device 5-2 not satisfying the requirements of the invention was fabricated in an identical manner to device 5-1 except the LEL consisted of a mixture of GaC-1 as the electron transporting co-host, NPB as the hole transporting co-host, and Ir(ppy)3 as a green phosphorescent emitter. The NPB comprised 30 wt. % of the total of the co-host materials in the LEL, and the Ir(ppy)₃ comprised 6 wt. % relative to the total of the co-host materials. Thus, device 5-2 had the following structure of layers: ITO|$CF_x$ (1 nm)|NPB (95 nm)|TCTA (10 nm)|GaC-1+30% NPB+6 wt. % Ir(pPy)₃ (35 nm)|GaC-1 (5 nm)|GaC-2 (45 nm)|LiF|Al.

A comparative device 5-3 not satisfying the requirements of the invention was fabricated in an identical manner to device 5-1 except that a blocking layer of GaC-1 was omitted. 50 nm of Bphen was used in place of GaC-2 in the ETL. Thus, device structure was: ITO|$CF_x$ (1 nm)|NPB (95 nm)|TCTA (10 nm)|GaC-1+6 wt. % Ir(Ppy)₃ (35 nm)|Bphen (50 nm)|LiF|Al.

A comparative device 5-4 not satisfying the requirements of the invention was fabricated in an identical manner to device 5-3 except that LEL consisted of a mixture of GaC-1, 30% NPB and 6% Ir(py)₃. Thus, device 5-4 had the following structure of layers: ITO|$CF_x$ (1 nm)|NPB (95 nm)|TCTA (10 nm)|GaC-1+30% NPB+6 wt. % Ir(ppy)₃ (35 nm)|Bphen (50 nm)|LiF|Al.

The devices thus formed were tested for efficiency and color at an constant current density of 1 mA/cm2 and the results are reported in Table 9 in the form of luminous yield (cd/A), voltage (V), power efficiency (lm/W), and CIE (Commission Internationale de l'Eclairage) coordinates.

TABLE 9

Evaluation results for comparative devices 5-1 through 5-4.

| Device | % NPB in the LEL | Luminous yield, cd/A | Voltage V | Power eff, Lm/W | EQE, % | CIEx, CIEy | Example |
|---|---|---|---|---|---|---|---|
| 5-1 | 0 | 68.7 | 4.6 | 46.9 | 19.0 | 0.333; 0.619 | comparison |

TABLE 9-continued

Evaluation results for comparative devices 5-1 through 5-4.

| Device | % NPB in the LEL | Luminous yield, cd/A | Voltage V | Power eff, Lm/W | EQE, % | CIEx, CIEy | Example |
|---|---|---|---|---|---|---|---|
| 5-2 | 30 | 27.3 | 4.8 | 17.9 | 7.5 | 0.336; 0.618 | comparison |
| 5-3 | 0 | 67.3 | 3.7 | 57.1 | 18.6 | 0.340; 0.615 | comparison |
| 5-4 | 30 | 25.2 | 3.9 | 20.3 | 7.0 | 0.349; 0.609 | comparison |

Obtained data show that addition of NPB into the LEL containing GaC-1 and a green phosphorescent emitter Ir(ppy)$_3$ significantly reduces luminous yield and power efficiency. These are all comparative devices since the phosphorescent emitter produces green light. It also should be noted that the triplet energy of NPB (2.50) is less than the triplet energy of Ir(ppy)$_3$ (2.54) and that the triplet energy of GaC-1 (2.57) is not at least 0.05 greater than Ir(ppy)$_3$.

Devices 5-1 through 54 were electrically aged at 10 mA/cm$^2$ in direct current mode at room temperature. Observed T$_{50}$ are shown in Table 10.

TABLE 10

Operational half-lives of devices 5-1 through 5-4.

| Device | % NPB in the LEL | Half-live (T$_{50}$), hours | Example |
|---|---|---|---|
| 5-1 | 0 | 28 | comparison |
| 5-2 | 30 | 3 | comparison |
| 5-3 | 0 | 29 | comparison |
| 5-4 | 30 | 3 | comparison |

Data show that addition of NPB into the LEL containing GaC-1 and a green phosphorescent emitter Ir(ppy)$_3$ results in significant reduction of device lifetime.

PARTS LIST

101 Substrate
103 Anode
105 Hole-Injecting layer (HIL)
107 Hole-Transporting layer (HTL)
108 Exciton Blocking Layer (EBL)
109 Light-Emitting layer (LEL)
110 Hole Blocking Layer (HBL)
111 Electron-Transporting layer (ETL)
113 Cathode
150 Current/Voltage source
160 Electrical conductors

The invention claimed is:

1. An OLED device comprising a cathode, an anode, and having therebetween a light-emitting layer containing:
    a) a phosphorescent emitter that emits light yellow, orange or red light,
    b) a tertiary arylamine compound as a first host material, and
    c) a gallium complex with only nitrogen bidentate ligands as a second host material,
    the OLED device further comprising an exciton-blocking layer located directly adjacent to the light-emitting layer on the anode side,
    wherein the gallium complex with only nitrogen bidentate ligands has a triplet energy at least 0.05 eV greater than the phosphorescent emitter, and
    wherein the exciton-blocking layer contains at least one material with a triplet energy equal to or greater than the phosphorescent emitter.

2. An OLED device of claim 1, wherein the first host is 60% or less by volume of the light-emitting layer.

3. An OLED device of claim 2, wherein the phosphorescent emitter contains Iridium.

4. An OLED device of claim 3, wherein the phosphorescent emitter emits yellow light.

5. An OLED device of claim 3, wherein the phosphorescent emitter emits orange light.

6. An OLED device of claim 3, wherein the phosphorescent emitter emits red light.

7. An OLED device of claim 1, wherein the gallium complex with only nitrogen bidentate ligands is according to Formula (PH2-2):

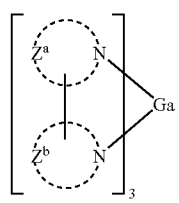

(PH2-2)

wherein each Z$^a$ and Z$^b$ is independently selected and represents the atoms necessary to complete an unsaturated heterocyclic ring and Z$^a$ and Z$^b$ are directly bonded to one another.

8. An OLED device of claim 7 wherein each nitrogen bidentate ligand contains only nitrogen and carbon atoms.

9. An OLED device of claim 8, wherein the gallium complex is according to Formula (PH2-3):

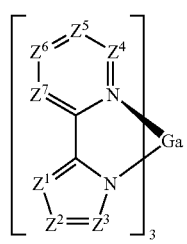

(PH2-3)

wherein each $Z^1$ through $Z^7$ represents N or C—Y with no more than two $Z^1$—$Z^7$ representing N and where Y represents hydrogen or an independently selected substituent.

10. An OLED device of claim 9, wherein no more than one $Z^1$—$Z^7$ is N.

11. An OLED device of claim 1, wherein the tertiary arylamine compound is represented by formula (PH1-1):

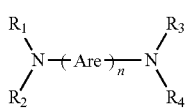
(PH1-1)

wherein each Are is an independently selected arylene group, such as a phenylene or anthracene moiety,
n is selected from 1 to 4, and
$R_1$—$R_4$ are independently selected aryl groups.

12. An OLED device of claim 1, wherein the tertiary arylamine compound is represented by formula (PH1-3):

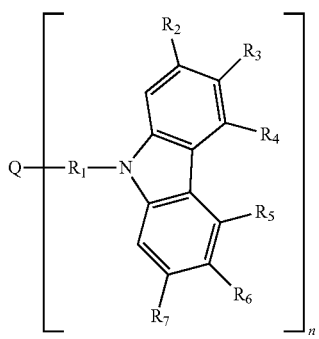
(PH1-3)

wherein Q independently represents nitrogen, carbon, silicon, a substituted silicon group, an aryl group, or substituted aryl group, preferably a phenyl group;
$R_1$ is an aryl or substituted aryl group;
$R_2$ through $R_7$ are independently hydrogen, alkyl, phenyl or substituted phenyl group, aryl amine, carbazole, or substituted carbazole; and
n is selected from 1 to 4;
or is represented by formula (PH1-4):

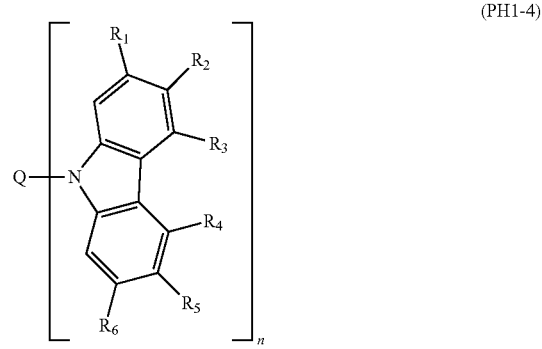
(PH1-4)

wherein, n is selected from 1 to 4;
Q independently represents phenyl group, substituted phenyl group, biphenyl, substituted biphenyl group, aryl, or substituted aryl group; and
$R_1$ through $R_6$ are independently hydrogen, alkyl, phenyl or substituted phenyl, aryl amine, carbazole, or substituted carbazole.

13. An OLED device of claim 1 where the tertiary arylamine first host has a triplet energy equal to or greater than the phosphorescent emitter.

14. An OLED device of claim 1 including on the cathode side of the light-emitting layer, an adjacent non-luminescent blocking layer in direct contact with the light-emitting layer, and an adjacent electron transporting layer structure in direct contact with the non-luminescent blocking layer.

15. An OLED device of claim 14 wherein the non-luminescent blocking layer contains a material with a HOMO at least 0.2 eV more negative than the HOMO of the tertiary arylamine compound in the light-emitting layer.

16. An OLED device of claim 14 wherein the non-luminescent blocking layer contains a material with a HOMO at least 0.2 eV more negative than the HOMO of the phosphorescent emitter in the light-emitting layer.

* * * * *